(12) United States Patent
Wesslin et al.

(10) Patent No.: US 12,180,588 B2
(45) Date of Patent: Dec. 31, 2024

(54) LOADING DEVICE, ARRANGEMENT AND METHOD FOR LOADING A REACTION CHAMBER

(71) Applicant: BENEQ OY, Espoo (FI)

(72) Inventors: Johannes Wesslin, Espoo (FI); Pekka Soininen, Espoo (FI); Jonas Andersson, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 18/475,316

(22) Filed: Sep. 27, 2023

(65) Prior Publication Data

US 2024/0026536 A1 Jan. 25, 2024

Related U.S. Application Data

(63) Continuation of application No. PCT/FI2022/050200, filed on Mar. 29, 2022.

(30) Foreign Application Priority Data

Mar. 30, 2021 (FI) ..................................... 20215378

(51) Int. Cl.
*C23C 16/455* (2006.01)
(52) U.S. Cl.
CPC .............................. *C23C 16/45544* (2013.01)
(58) Field of Classification Search
CPC ......... H01L 21/67706; H01L 21/67748; H01L 21/67742; H01L 21/6719; C23C 16/45544
See application file for complete search history.

(56) References Cited

U.S. PATENT DOCUMENTS

| 5,855,680 | A | 1/1999 | Soininen et al. |
| 6,132,516 | A | 10/2000 | Hayashi et al. |
| 2001/0013312 | A1 | 8/2001 | Soininen et al. |
| 2006/0016350 | A1* | 1/2006 | Yoshidome .......... H05B 6/6429 99/483 |
| 2012/0067284 | A1 | 3/2012 | Soininen et al. |

(Continued)

OTHER PUBLICATIONS

International Search Report issued by the Finnish Patent and Registration Office acting as the International Searching Authority in relation to International Application No. PCT/FI2022/050200 dated Jun. 30, 2022 (4 pages).

(Continued)

*Primary Examiner* — Joseph A Miller, Jr.
(74) *Attorney, Agent, or Firm* — Robert P. Michal, Esq.; Carter, DeLuca & Farrell LLP

(57) ABSTRACT

A loading device, arrangement, and method for loading a reaction chamber inside a vacuum chamber. The loading device includes a loading platform arranged to support the reaction chamber, the loading platform having a first end, a second end and a first direction, a first loading member provided to the loading platform, and a second loading member provided to the loading platform, the first loading member being arranged independently movable in relation to the loading platform and the second loading member in the first direction, and the second loading member being arranged independently movable in relation to the loading platform and the first loading member in the first direction.

13 Claims, 18 Drawing Sheets

(56) References Cited

U.S. PATENT DOCUMENTS

2019/0127850 A1   5/2019   Soderlund et al.

OTHER PUBLICATIONS

Written Opinion of the International Searching Authority issued by the Finnish Patent and Registration Office acting as the International Searching Authority in relation to International Application No. PCT/FI2022/050200 dated Jun. 30, 2022 (6 pages).
Finnish Search Report issued by the Finnish Patent and Registration Office acting in relation to Finnish Application No. 20215378 dated Oct. 27, 2021 (2 pages).

* cited by examiner

LOADING DEVICE, ARRANGEMENT AND METHOD FOR LOADING A REACTION CHAMBER

CROSS-REFERENCE TO RELATED APPLICATIONS

This application is a continuation of PCT International Application No. PCT/FI2022/050200 filed Mar. 29, 2022, which claims priority to Finnish Patent Application No. 20215378, filed Mar. 30, 2021, the disclosure of each of these applications is expressly incorporated herein by reference in their entirety.

FIELD OF THE INVENTION

The present invention relates to a loading device for loading a reaction chamber inside a vacuum. The present invention further relates to an arrangement for atomic layer deposition. The present invention also relates to a method for loading and unloading of a reaction chamber to and from a vacuum chamber.

BACKGROUND OF THE INVENTION

Reaction chamber of an atomic layer deposition apparatus usually comprises a vacuum chamber and a reaction chamber inside the vacuum chamber. Substrates are processed inside the reaction chamber. Precursor gases are supplied int the reaction chamber from outside the vacuum chamber. The reaction chamber may be a fixed reaction chamber which is fixed inside the vacuum chamber and substrate are loaded directly inside reaction chamber which is fixedly arranged inside the vacuum chamber. Alternatively, the reaction chamber is a separate and movable reaction chamber which is loaded to and unloaded from the vacuum chamber. In the latter case, the substrates are loaded into and unloaded from the reaction chamber when the reaction chamber is outside the vacuum chamber. The separate and movable reaction chamber is preferable, as it allows efficient processing and minimal process down time as the substrate loading and unloading can be carried out outside vacuum chamber.

Large substrates require large and massive reaction chambers. These large reactions chambers are difficult to move and transport. Long moving arms are needed in order to load and unload the large reaction chamber to and from the vacuum chamber. The large moving arms or bulky moving mechanism require and occupy large floor area and compromise handling of the reaction chamber in efficient manner in the process facility. Further, the co-operation of the atomic layer deposition apparatus with other process apparatus is compromised as transporting the large reaction chamber to and from the vacuum chamber becomes difficult.

BRIEF DESCRIPTION OF THE INVENTION

An object of the present invention is to provide a loading device, arrangement and method so as to overcome or at least alleviate the prior art disadvantages.

The preferred embodiments of the invention are disclosed in the dependent claims.

The invention is based on the idea of providing a loading device for loading a reaction chamber inside a vacuum chamber. The loading device comprises a loading platform arranged to support the reaction chamber, the loading platform having a first end, a second end and a first direction extending in a direction between the first end and the second end. The loading device further comprises a first loading member provided to the loading platform, the first loading member comprising a first loading connector arranged to provide mechanical connection to the reaction chamber, and a second loading member provided to the loading platform, the second loading member comprising a second loading connector arranged to provide mechanical connection to the reaction chamber. The first loading member is arranged independently movable in relation to the loading platform and the second loading member in the first direction, and the second loading member is arranged independently movable in relation to the loading platform and the first loading member in the first direction.

The independently movable first and second loading members enable continues loading movement without long loading arms. Further, the independently movable first and second loading members enable utilizing them in alternately manner.

In one embodiment, the first loading member is arranged independently movable in relation to the loading platform and the second loading member in a second direction transversal to the first direction, and the second loading member being arranged independently movable in relation to the loading platform and the first loading member in a second direction transversal to the first direction.

Therefore, the first and second loading members may be independently mechanically connected to and disconnected from the reaction chamber to be loaded in the second direction.

In an alternative embodiment, the first loading connector of the first loading member being arranged independently movable in relation to the loading platform and the second loading member in a second direction transversal to the first direction, and the second loading connector of the second loading member being arranged independently movable in relation to the loading platform and the first loading member in a second direction transversal to the first direction.

Thus, the first and second loading connectors may be independently mechanically connected to and disconnected from the reaction chamber to be loaded in the second direction. The loading members do not need to be moved in the second direction.

In one embodiment, the loading device comprises a first loading motor connected to the first loading member and arranged to move the first loading member in the first direction with a first loading movement, and a second loading motor connected to the second loading member and arranged to move the second loading member in the first direction with a second loading movement.

The first loading motor is arranged to move the first loading member in the first direction independently from the second loading member. The second loading motor is arranged to move the second loading member in the first direction independently from the first loading member.

In one embodiment, the loading device comprises a first connection motor connected to the first loading member and arranged to move the first loading member in the second direction with a first connection movement, and a second loading motor connected to the second loading member and arranged to move the second loading member in the second direction with a second connection movement.

The first connection motor is arranged to move the first loading member in the second direction independently from the second loading member for connection and disconnecting the first loading member. The second connection motor is arranged to move the second loading member in the second direction independently from the first loading member for connection and disconnecting the second loading member.

In an alternative embodiment, a first connection motor connected to the first loading connector of the first loading member and arranged to move the first loading connector in the second direction with a second connection movement, and a second loading motor connected to the second loading connector of the second loading member and arranged to move the second loading connector in the second direction with a second connection movement.

The first connection motor is arranged to move the first loading connector in the second direction independently from the second loading member and second loading connector for connection and disconnecting the first loading member. The second connection motor is arranged to move the second loading connector in the second direction independently from the first loading member and the first loading connector for connection and disconnecting the second loading member. The loading members do not need to be moved in the second direction.

In one embodiment, the first loading member comprises a first loading arm extending in the first direction and the second loading member comprises a second loading arm extending in the first direction, the first and second loading arms being arranged spaced apart from each other.

The first and second longitudinal loading arms may move the reaction chamber in alternating manner enabling efficient loading and unloading without large loading arms.

In one embodiment, the first loading connector comprises a first connector pin, and the second loading connector comprises a second connector pin.

In an alternative embodiment, the first loading connector comprises a first connector hole, and the second loading connector comprises a second connector hole.

In one embodiment, the first and second connector pins extend in the second direction.

In an alternative embodiment, the first and the second connector hole extend in the second direction.

The first and second connector pins as well as the first and second connector holes extend in the second direction such that the mechanical connection to the reaction chamber may be provided by the movement of the loading members or loading connectors in the second direction.

In one embodiment, the loading platform comprises a first transport track extending in the first direction, a second transport track extending in the first direction and arranged spaced apart from the first transport track, the first and second transport tracks being arranged to support the reaction chamber during loading.

The first and second transport track provide movement guides for the first and second loading member, respectively, in the first direction.

In an alternative embodiment, the loading platform comprises only one transport track extending in the first direction and arranged to support the reaction chamber during loading. The one transport track is preferably arranged along centre line of the loading platform. The centre line is centre in the direction perpendicular to the first direction, meaning the width direction of the loading platform.

In one embodiment, the loading device comprises a body, the loading platform being rotatably supported to the body.

Accordingly, the orientation of the loading platform and the first and second loading members may be adjusted by rotating the loading platform relative to the body. Thus, the loading platform is rotatably supported to the body and arranged to be rotated relative to the body. The rotation axis preferably extends in vertical direction for rotating the loading platform in horizontal direction around the rotation axis.

The present invention is further based on the idea of providing an arrangement for atomic layer deposition. The arrangement comprises a vacuum chamber provided with a loading opening, and a loading device arranged opposite the loading opening of the vacuum chamber for loading a reaction chamber into the vacuum chamber via the loading opening. The loading device comprises a first transport track extending in a first direction of the loading device, and a second transport track extending in the first direction. The loading device further comprises a first loading member provided with a first loading connector arranged to provide connection to the reaction chamber, and a second loading member provided with a second loading connector arranged to provide connection to the reaction chamber. The first loading member is arranged independently movable in relation to the second loading member and to the vacuum chamber in the first direction, and the second loading member is arranged independently movable in relation to the first loading member and to the vacuum chamber in the first direction.

Therefore, the loading of the reaction chamber into the vacuum chamber and from the vacuum chamber may be carried out with utilizing the first and second loading members independently in alternating manner. Therefore, the dimensions of the loading members and the loading device may be minimized.

In one embodiment, the arrangement further comprises a movable reaction chamber comprising a first support track extending in a third direction of the reaction chamber and arranged to be supported to the first transport track of the loading device, and a second support track extending in the third direction and arranged to be supported to the second transport track of the loading device. The movable reaction chamber further comprises two or more first counter connectors provided successively in the third direction and arranged to be connected with the first loading connector the first loading member, and two or more second counter connectors provided successively in the third direction and arranged to be connected with the second loading connector of the second loading member.

Accordingly, the movable reaction chamber may be moved along the first and second transport track in the first direction of the loading device.

In an alternative embodiment, the loading device, or the loading platform, comprises only one transport track extending in the first direction and arranged to support the reaction chamber during loading. Similarly, the movable reaction chamber comprising only one support track extending in the third direction of the reaction chamber and arranged to be supported to the one transport track of the loading device. Thus, the movable reaction chamber is supported to the loading device with by the one transport track and the one support track.

The one transport track is preferably arranged along centre line of the loading platform. The centre line is centre in the direction perpendicular to the first direction, meaning the width direction of the loading platform. The one support track is preferably arranged along centre line of the movable reaction chamber. The centre line is centre in the direction perpendicular to the third direction, meaning the width direction of the movable reaction chamber.

In one embodiment, the first loading member is arranged independently movable in relation to second loading member in a second direction transversal to the first direction, and the second loading member being arranged independently movable in relation to the first loading member in the second direction transversal to the first direction Therefore, the first and second loading members may be independently and separate connected to and disconnected from movable reaction chamber by movement of the first and second loading members in the second direction.

In an alternative embodiment, the first loading connector of the first loading member being arranged independently movable in relation to the second loading member in a second direction transversal to the first direction, and the second loading connector of the second loading member being arranged independently movable in relation to the first loading member in the second direction transversal to the first direction.

Therefore, the first and second loading connectors may be independently and separate connected to and disconnected from movable reaction chamber by movement of the first and second loading connectors in the second direction.

In one embodiment, the first loading connector comprises a first connector pin and the two or more first counter connectors comprise a two or more first counter connector holes, the first connector pin and the two or more first counter connector holes extending in the second direction transversal to the first direction and to the third direction, and the second loading connector comprises a second connector pin and the two or more second counter connectors comprise a two or more second counter connector holes, the second connector pin and the two or more second counter connector holes extending in the second direction transversal to the first direction and to the third direction.

The first and second connector pins may be arranged in a first and second counter connector holes, respectively, by moving the loading members or the loading connectors in the second direction.

In one embodiment, the loading opening of the vacuum chamber comprises a lower opening edge and that the first and second transport tracks are arranged in vertical direction above the lower opening edge of the loading opening.

Accordingly, the reaction chamber may be transported, and loaded to and unloaded form the vacuum chamber in horizontal direction.

The loading device of the arrangement is preferably a loading device as disclosed above.

The present invention is further based on the idea of providing a method for loading and unloading of a reaction chamber to and from a vacuum chamber comprising a loading opening. The method is carried out with a loading device arranged opposite the loading opening of the vacuum chamber, the loading device comprising a first loading member provided with a first loading connector arranged to provide connection to the reaction chamber, the first loading member being arranged independently movable in a first direction of the loading device, and a second loading member provided with a second loading connector arranged to provide connection to the reaction chamber, the second loading member being arranged independently movable in the first direction of the loading device. The reaction chamber comprises two or more first counter connectors provided successively along a third direction of the reaction chamber and arranged to provide connection with the first loading connector the first loading member, and two or more second counter connectors provided successively along the third direction of the reaction chamber and arranged to provide connection with the second loading connector of the second loading member.

The method comprises loading the reaction chamber to the vacuum chamber, the loading comprising steps:
a) supporting the reaction chamber movably to the loading device such that the first direction of the loading device and the third direction of the reaction chamber extend parallel to each other,
b) setting the first loading member to a first initial loading position and connecting the first loading connector of the first loading member to a first counter connector of the reaction chamber corresponding the first initial loading position,
c) transferring the reaction chamber towards the vacuum chamber in the first direction by moving the first loading member connected to the reaction chamber to a first forward position in the first direction,
d) setting the second loading member (124) to a second initial loading position and connecting the second loading connector of the second loading member to a second counter connector of the reaction chamber corresponding the second initial loading position,
e) disconnecting the first loading connector of the first loading member from the first counter connector of the reaction chamber, and
f) transferring the reaction chamber towards the vacuum chamber in the first direction by moving the second loading member connected to the reaction chamber to a second forward position in the first direction.

The method of the present invention enables loading the reaction chamber into the vacuum chamber without long arms by utilizing the arms in alternate manner.

In one embodiment, the method further comprises steps:
g) moving the first loading member disconnected from the reaction chamber to a first backward position in the first direction away from the vacuum chamber, the step g) being carried out after step e),
h) connecting the first loading connector of the first loading member to a first counter connector of the reaction chamber corresponding the first backward position,
i) disconnecting the second loading connector of the second loading member from the second counter connector of the reaction chamber, and
j) transferring the reaction chamber towards the vacuum chamber in the first direction by moving the first loading member connected to the reaction chamber towards the vacuum chamber in the first direction.

Carrying out the moving such that the first and or second loading member is utilized two or more times in alternating manner enables moving the reaction chamber a prolonged distance on the first direction.

In one embodiment, the method comprises unloading the reaction chamber to the vacuum chamber, the unloading comprising steps:
k) setting the first loading member to a first initial unloading position and connecting the first loading connector of the first loading member to a first counter connector of the reaction chamber corresponding the first initial unloading position,
l) transferring the reaction chamber away from the vacuum chamber in the first direction by moving the first loading member connected to the reaction chamber to a first backward position in the first direction,
m) setting the second loading member to a second initial unloading position and connecting the second loading connector of the second loading member to a second counter connector of the reaction chamber corresponding the second initial unloading position, n) disconnecting the first loading connector of the first loading member from the first counter connector of the reaction chamber, and o) transferring the reaction chamber away from the vacuum chamber in the first direction by moving the second loading member connected to the reaction chamber to a second backward position in the first direction.

Accordingly, the reaction chamber may be unloaded from the vacuum chamber in similar manner as loading.

In one embodiment, the method and unloading further comprises steps:

p) moving the first loading member disconnected from the reaction chamber to a first forward position in the first direction towards the vacuum chamber, the step p) being carried out after step n), q) connecting the first loading connector of the first loading member to a first counter connector of the reaction chamber corresponding the first forward position, r) disconnecting the second loading connector of the second loading member from the second counter connector of the reaction chamber, and s) transferring the reaction chamber away from the vacuum chamber in the first direction by moving the first loading member connected to the reaction chamber away from the vacuum chamber in the first direction.

Carrying out the moving such that the first and or second loading member is utilized two or more times in alternating manner enables moving the reaction chamber a prolonged distance on the first direction.

In one embodiment, the connecting the connecting the first loading connector of the first loading member to a first counter connector of the reaction chamber and disconnecting the first loading connector of the first loading member from the first counter connector of the reaction chamber is carried out by moving the first loading member or the first loading connector in a second direction, the second direction being transversal to the first direction, and the connecting the connecting the second loading connector of the second loading member to a second counter connector of the reaction chamber and disconnecting the second loading connector of the first loading member from the second counter connector of the reaction chamber is carried out by moving the second loading member or the second loading connector in the second direction, the second direction being transversal to the first direction.

Thus, the first and second loading members may be connected and disconnected to the reaction chamber with simple movement such that the reaction chamber may be efficiently moved.

The method is preferably carried out with an arrangement and loading device as disclosed above.

An advantage of the invention is that the loading device, arrangement and method enables moving the reaction chamber long way without using long movements and long arms. This further enables providing a rotating loading platform and at the same arranging the loading device close to the vacuum chamber.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
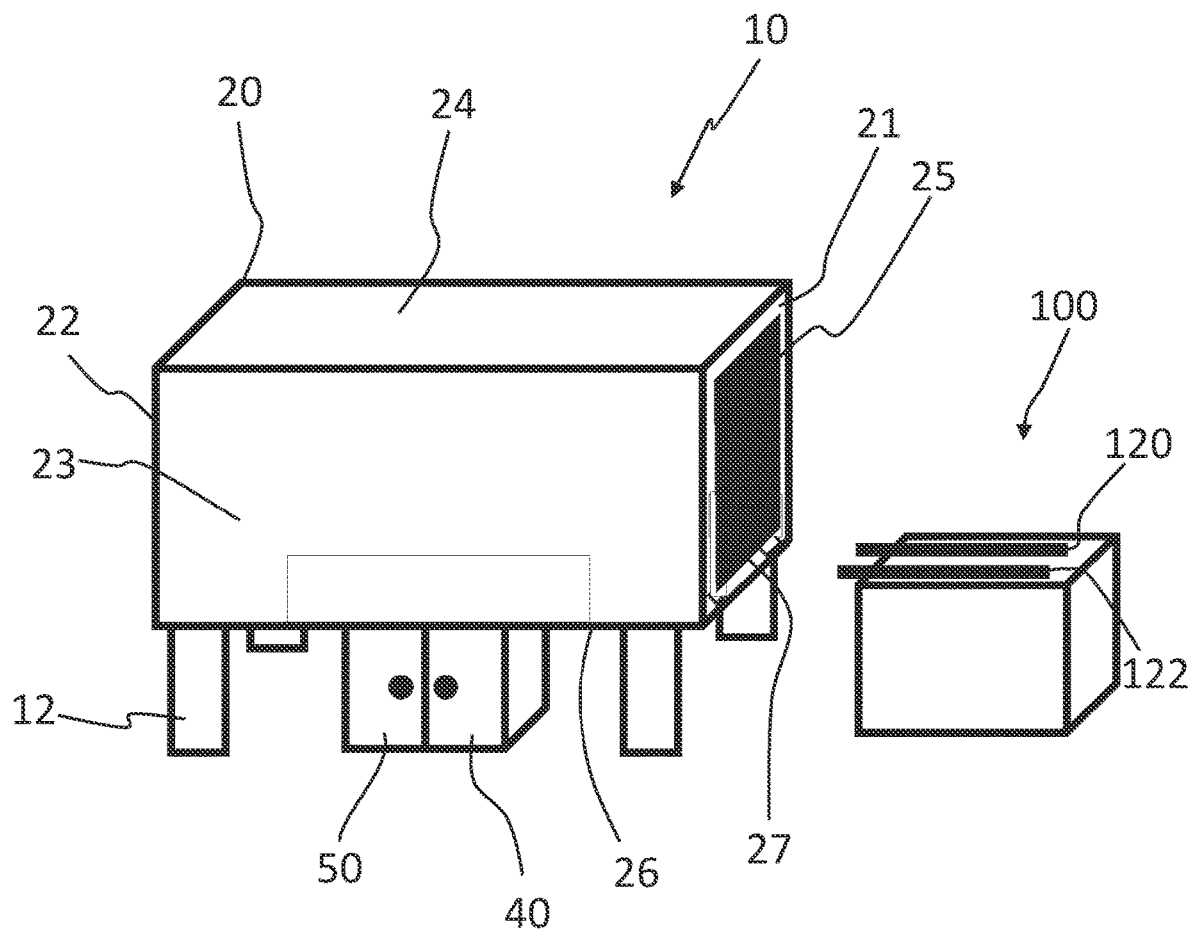
FIG. 1 shows a schematic view of an atomic layer deposition apparatus and a loading device.

FIG. 1 shows schematically an arrangement for atomic layer deposition or an atomic layer deposition reactor arrangement having an atomic layer deposition reactor 10.

The atomic layer deposition reactor 10 comprises a vacuum chamber 20 having a front wall 21, or a loading wall 21, provided with a loading opening 25 for loading and unloading substrates or separate reaction chambers inside and from the vacuum chamber 20. The loading wall 21 is a vertically or upwards extending loading wall 21. The loading opening 25 provides an opening between inside of the vacuum chamber 20 and outside of the vacuum chamber 20. The loading opening 25 is provided with a loading door (not shown) for opening and closing the loading opening 25.

The vacuum chamber 20 further comprises a back wall 22 opposite the front wall 21, a top wall 24, a bottom wall 26 opposite top wall 24, and side walls 23 extending between the front wall 21 and the back wall 22 and between the top wall 24 and the bottom wall 26.

In an alternative embodiment, the vacuum chamber 20 may be cylindrical vacuum chamber extending in horizontal direction. The top wall 24, bottom wall 26 and the side walls 23 are replaced by a cylindrical sheath wall extending between the front wall 21 and the back wall 22.

The vacuum chamber walls 21, 22, 23, 24, 26 are provided structurally vacuum sustainable. Thus, the vacuum chamber walls 21, 22, 23, 24, 26 are arranged to sustain considerable vacuum conditions during processing without damaging.

The atomic layer deposition reactor 10 comprises chamber support legs 12 for supporting the vacuum chamber 20 on a support surface, such as a facility floor. The chamber support legs 12 are provided such that the vacuum chamber 20 and the loading opening 25 are arranged at a handling height from the support surface enabling loading and unloading of substrates or separate reaction chambers into and from the vacuum chamber without need to lift or move the substrates or separate reaction chambers in vertical direction. The loading opening 25 comprises a lower loading opening edge 27 arranged at the handling height.

The chamber support legs 12 are provided under the vacuum chamber 20. The chamber support legs 12 extend from and are provided to the bottom surface 26 of the vacuum chamber 20.

It should be noted that the chamber support legs 12 may be replaced with any suitable support members arranged to support the vacuum chamber 20 on the support surface.

The atomic layer deposition reactor 10 further comprises a precursor system 40 arranged to supply one or more precursor gases to a reaction chamber inside the vacuum chamber 20 and to discharge precursor gases from the reaction chamber inside the vacuum chamber 20. The precursor system 40 comprises one or more precursor sources (not shown), supply conduits (not shown), discharge conduits (not shown) and one or more supply and/or discharge pumps (not shown). The precursor system 40 is arranged to subject the surfaces of the substrates to one or more precursor gases inside the vacuum chamber 20 and the reaction chamber.

The atomic layer deposition reactor 10 further comprises vacuum system 50 arranged to provide vacuum inside vacuum chamber 20 when the loading opening 25 is closed. The vacuum system 50 comprises one or more vacuum devices such as vacuum pumps for generating the vacuum conditions inside the vacuum chamber 20.

It should be noted that in some embodiment, the vacuum chamber 20 forms also the reaction chamber.

The arrangement is further provided with a loading device 100. The loading device is arranged opposite the loading wall 21 and the loading opening 25 of the vacuum chamber 20. The loading device 100 is arranged to load a separate reaction chamber or separate substrates into the vacuum chamber 20 through the loading opening 25. The loading device 100 is arranged to load a separate reaction chamber or separate substrates into the vacuum chamber 20 through the loading opening 25.

The loading device 100 comprises a first loading member 120 and a second loading member 122. The first and second loading member 120, 122 are arranged to load and unload a separate reaction chamber to and from the vacuum chamber 20 via the loading opening 25.

The first and second loading members 120, 122 are arranged in the loading device 100 above the lower loading opening edge 27 such that the separate reactor chamber is arranged to be transported to and from the vacuum chamber in horizontal direction.

Figure 2:
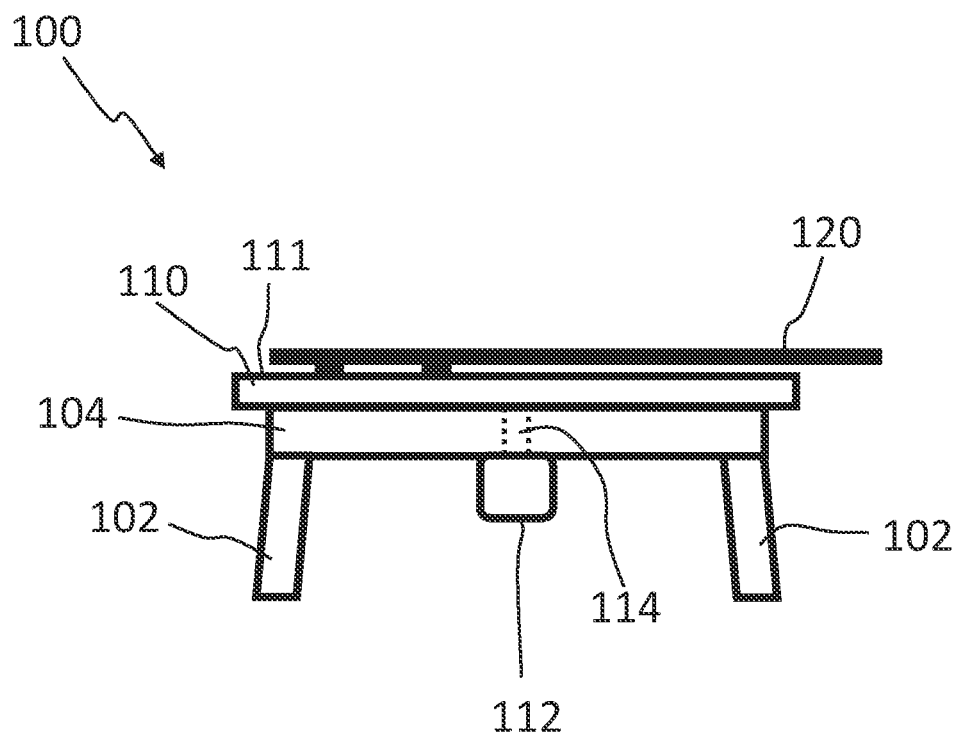
FIG. 2 shows a schematic side view of a loading device according to the present invention.

FIG. 2 shows a schematic side view of one embodiment of the loading device 100 according to the present invention. The loading device 100 comprises a loading device body 104 supported to a support surface, such as the facility floor, with one or more support legs 102.

The loading device 100 further comprises a loading platform 110. The loading platform 110 is a loading table or a loading plate. The loading platform 110 is supported to the loading device body 104. The loading platform 110 is rotatably supported to the loading device body 104 such that the loading platform 110 is rotatable in horizontal direction and in the direction of the upper surface 111 of the loading platform 110. The loading device 100 comprises a vertical rotation axis 114 and the loading platform 110 is arranged to be rotatably supported to the loading device body 104 such that the loading platform 110 is rotatable in relation to the loading device body 104 around the vertical rotation axis 114. The vertical rotation axis 114 is connected to the loading platform 110. The loading device 100 further comprises a rotation motor 112 connected to the vertical rotation axis 114 and arranged to rotate the vertical rotation axis and further the loading platform 110.

The loading device 100 further comprises the first and second loading members 120, 122 provided to the loading platform 110. The first and second loading members 120, 122 are supported to the loading platform 110 and arranged to turn or rotate together with the loading platform 110 around the rotation axis 114.

As shown in FIG. 2, the first and second loading members are supported on the upper surface 111 of the loading platform 110.

Figure 3:
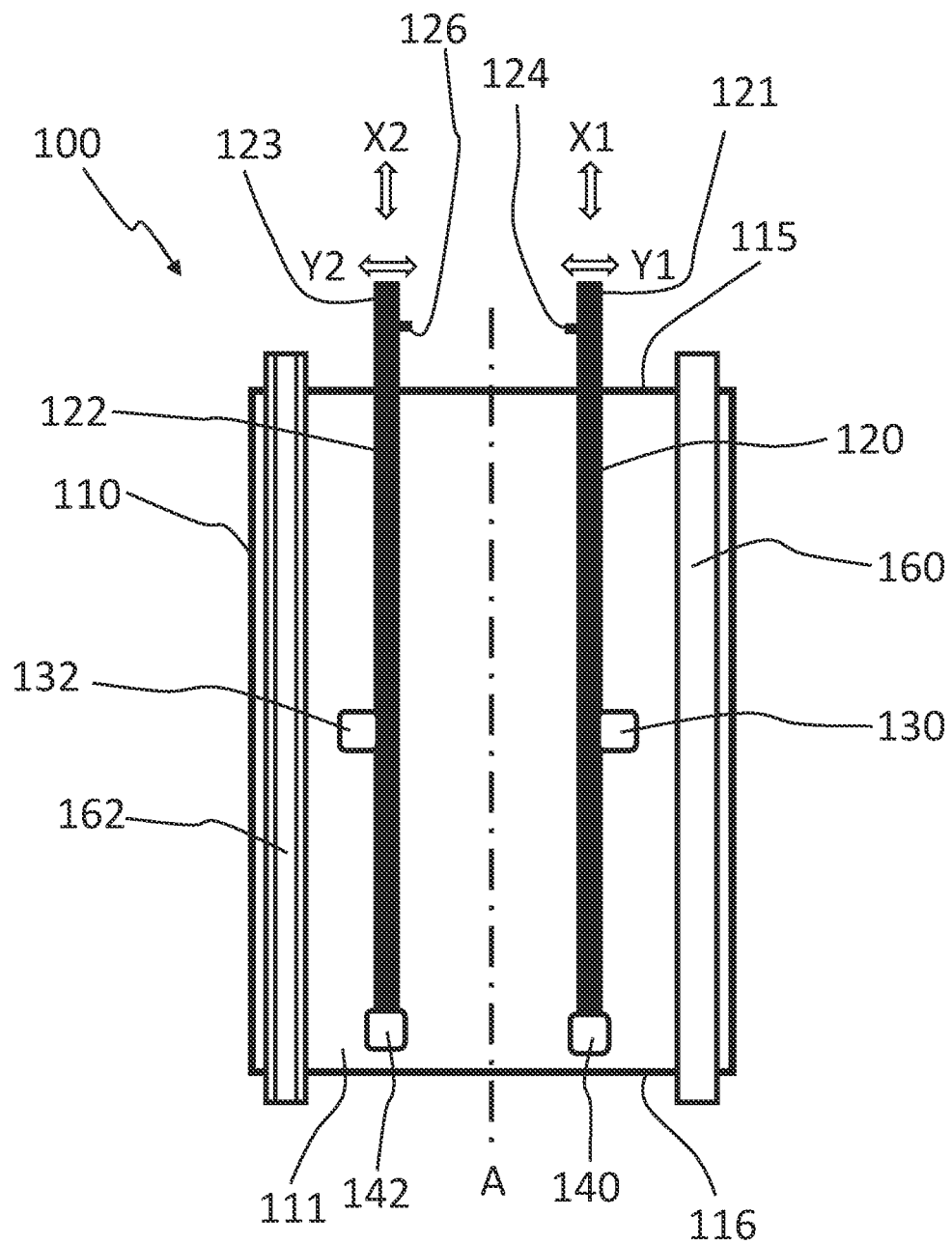
FIG. 3 shows a schematic top view of an embodiment of a loading device according to the present invention.

FIG. 3 shows an upper view of the loading device 10 and the loading platform 110. The loading platform 110 comprises a first end 115, a second end 116 and a first direction A extending in a direction between the first end 115 and the second end 116. The first end 115 is arranged opposite to and towards the loading opening of the vacuum chamber 20.

The loading platform 110 is provided with the first loading member 120. The first loading member 120 is formed as a longitudinal loading arm extending in the first direction A. The first loading member 120 is provided with a first loading connector 124 for providing a connection with the reaction chamber.

The first loading connector 124 is provided to a first distal end 121 of the first loading arm 120 or in the vicinity thereof. The first distal end 121 is towards the vacuum chamber 20. In the embodiment of FIG. 3, the first loading connector 124 is a first connector pin extending from the first loading arm 120 transversely or perpendicularly to the first direction A.

The loading platform 110 is further provided with the second loading member 122. The second loading member 122 is formed as a longitudinal loading arm extending in the first direction A. The first and second loading arms 120, 122 are arranged parallel to each other and space apart from each other. The second loading member 122 is provided with a second loading connector 126 for providing a connection with the reaction chamber.

The second loading connector 126 is provided to a second distal end 123 of the second loading arm 120 or in the vicinity thereof. The second distal end 123 is towards the vacuum chamber 20. In the embodiment of FIG. 3, the second loading connector 126 is a second connector pin extending from the second loading arm 122 transversely or perpendicularly to the first direction A.

In FIG. 3, the first connector pin 124 extends from the first loading arm 120 towards the second loading arm 122 transversely to the first direction A. Similarly, the second connector pin 126 extends from the second loading arm 122 towards the first loading arm 120 transversely to the first direction A.

The first loading arm 120 is arranged independently movable in relation to the loading platform 110 and the second loading arm 122 in the first direction A. Thus, the first loading arm 120 is arranged independently movable in the longitudinal direction of the first loading arm 120 and in the first direction A. The first loading arm 120 is arranged to be moved on the loading platform 110 in the first direction A.

The loading device 100 comprises a first loading motor 140 arranged to move the first loading arm 120 in the first direction A with a first loading movement X1. The first loading motor 140 is connected or operatively connected to the first loading arm 120.

The first loading member 120 is further arranged independently movable in relation to the loading platform 110 and the second loading member 122 in a second direction transverse or perpendicular to the first direction A. Thus, the first loading arm 120 is arranged independently movable transversely or perpendicularly to the longitudinal direction of the first loading arm 120 and the first direction A. The first loading arm 120 is arranged to be moved on the loading platform 110 in the second direction.

The loading device 100 comprises a first connection motor 130 arranged to move the first loading arm 120 in the second direction with a first connection movement Y1. The first connection motor 130 is connected or operatively connected to the first loading arm 120.

The second loading arm 122 is arranged independently movable in relation to the loading platform 110 and the first loading arm 120 in the first direction A. Thus, the second loading arm 122 is arranged independently movable in the longitudinal direction of the second loading arm 122 and in the first direction A. The second loading arm 122 is arranged to be moved on the loading platform 110 in the first direction A.

The loading device 100 comprises a second loading motor 142 arranged to move the second loading arm 122 in the first direction A with a second loading movement X2. The second loading motor 142 is connected or operatively connected to the second loading arm 122.

The second loading member 122 is further arranged independently movable in relation to the loading platform 110 and the first loading member 120 in the second direction transverse or perpendicular to the first direction A. Thus, the second loading arm 122 is arranged independently movable transversely or perpendicularly to the longitudinal direction of the second loading arm 122 and the first direction A. The second loading arm 122 is arranged to be moved on the loading platform 110 in the second direction.

The loading device 100 comprises a second connection motor 132 arranged to move the second loading arm 122 in the second direction with a second connection movement Y2. The second connection motor 132 is connected or operatively connected to the second loading arm 122.

The loading platform 110 is further provided with a first transport track 160 extending in the first direction A. The first transport track 160 is supported on the upper surface 111 of the loading platform 110.

In the embodiment of FIG. 3, the first transport track 160 is arranged to extend in the first direction A from the first end 115 to the second end 116 of the loading platform 110

The loading platform 110 is further provided with a second transport track 162 extending in the first direction A. The second transport track 162 is supported on the upper surface 111 of the loading platform 110.

In the embodiment of FIG. 3, the second transport track 162 is arranged to extend in the first direction A from the first end 115 to the second end 116 of the loading platform 110.

The first and second transport track 160, 162 are arranged to extend parallel to each other in the first direction A and spaced apart from each other. The first and second loading arms 120, 12 are provided between the first and second transport tracks 160, 162. The first and second transport track 160, 162 are arranged to support the reaction chamber during loading to and unloading from the vacuum chamber 20. Further, the reaction chamber is arranged to move on and along the first and second transport tracks 160, 162 in the first direction A.

Figure 4:
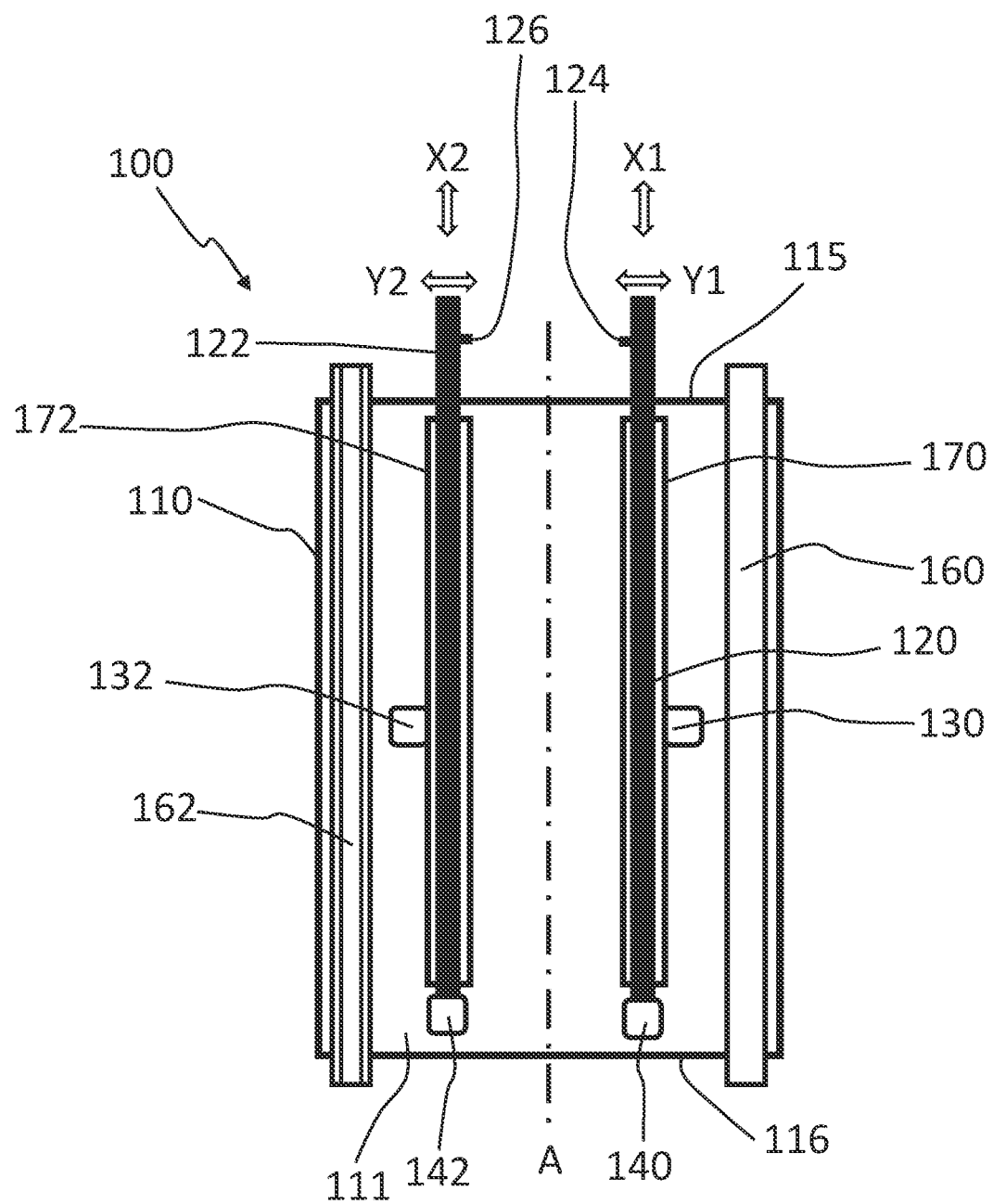
FIG. 4 shows a schematic top view of another embodiment of a loading device according to the present invention.

FIG. 4 shows an alternative embodiment, in which the first loading arm 120 is supported to a first loading track 170. The first loading track 170 extends in the first direction A and the first loading arm 120 is arranged to move in the first direction A along the first loading track 170 with the first loading movement X1 by the first loading motor 140.

Further, the first connection motor 130 is arranged to move the first loading arm 120 in the second direction in the first loading track 170.

The second loading arm 122 is supported to a second loading track 172. The second loading track 172 extends in the first direction A and the second loading arm 122 is arranged to move in the first direction A along the second loading track 172 with the second loading movement X2 by the second loading motor 142.

Further, the second connection motor 132 is arranged to move the second loading arm 122 in the second direction in the second loading track 172.

The first and second loading tracks 170, 172 are provided and supported to the upper surface 111 of the loading platform 110. The first and second loading track 170, 172 are fixed the loading platform 110.

Figure 5:
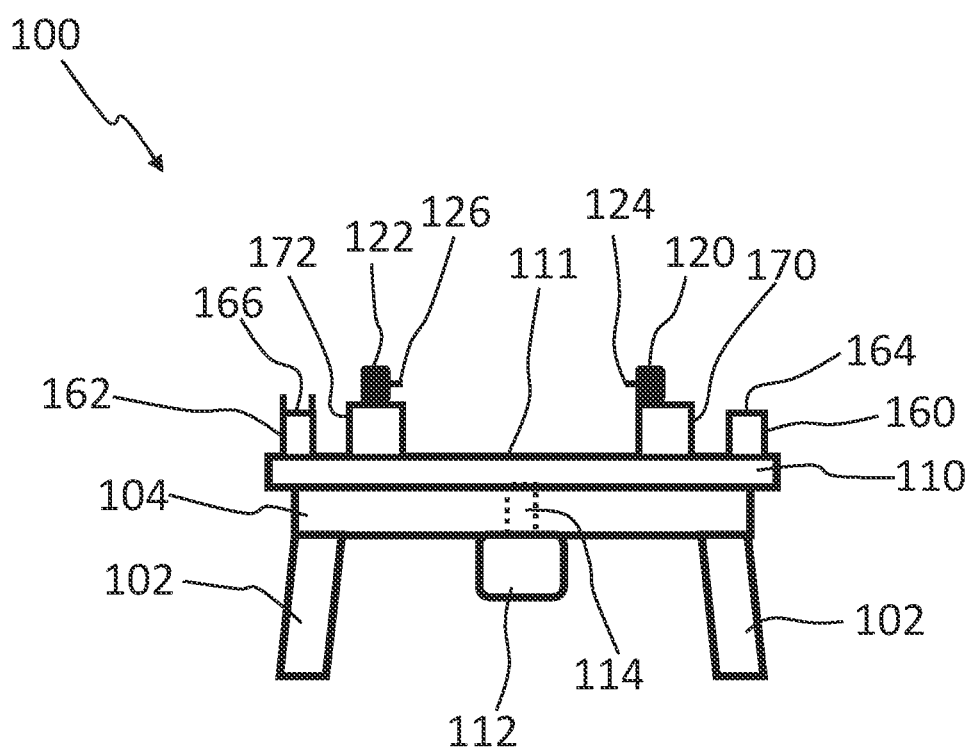
FIG. 5 shows a schematic end view of the loading device of FIG. 4.

FIG. 5 shows an end view of the loading device 100 of FIG. 4. The first transport track 160 comprises a first transport surface 162, an upper surface, arranged to support the reaction chamber. The second transport track 162 comprises a second transport surface 166, an upper surface, arranged to support the reaction chamber. The second transport track 162 comprises a groove extending along the second transport track 162. The second support surface 166 is provided as a bottom surface of the groove. The side walls of the groove provide side support for the reaction chamber during loading and unloading along the first and second transport tracks 160, 162.

Figure 6:
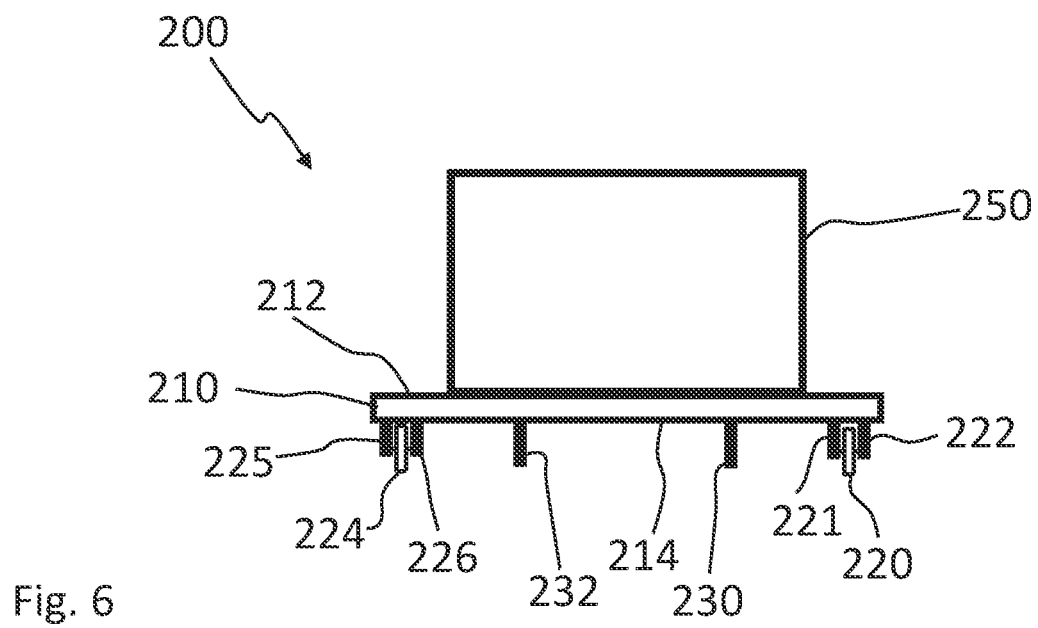
FIG. 6 shows a schematic end view one embodiment of a reaction chamber.

FIG. 6 shows a reaction chamber 200 which is to be supported to the loading device 100 and on the loading platform 110. The reaction chamber 200 comprises a chamber base 210 and a process chamber 250 supported to the chamber base 210. The process chamber 250 is supported on an upper base surface 212 of the chamber base 210. The chamber base 210 and the reaction chamber 200 comprises a first chamber end 215 and a second chamber end 216.

The chamber base 210 is provided with a first longitudinal support track 220, 221, 222 and a second longitudinal support track 224, 225, 226. The first and second longitudinal support tracks 220, 221, 22, 224, 225, 226 are arranged space apart from each other and to extend parallel to each other. The first support track 220, 221, 222 is arranged to be supported to the first transport track 160, or to the first transport surface 164. The second support track 224, 225, 226 is arranged to be supported to the second transport track 162, or to the second transport surface 166.

The first and second longitudinal support tracks 220, 221, 22, 224, 225, 226 are arranged on a bottom surface 214 of the chamber space 210.

Figure 7:
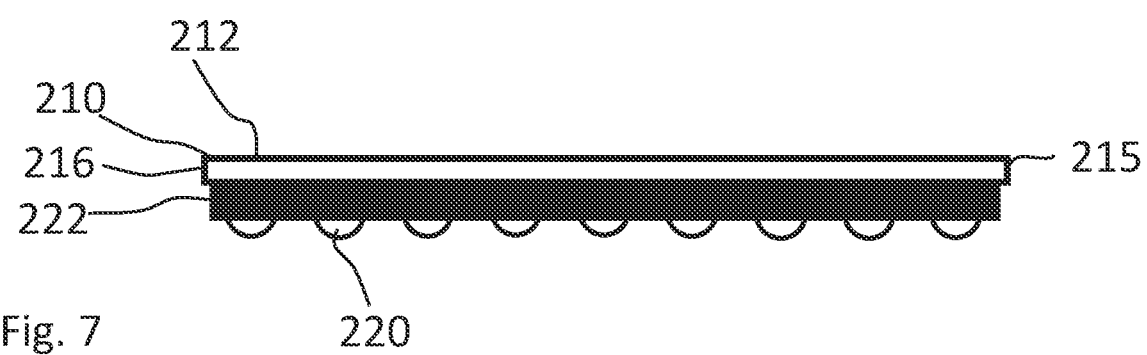
FIG. 7 shows a schematic side view of a support track of a reaction chamber.
Figure 13:
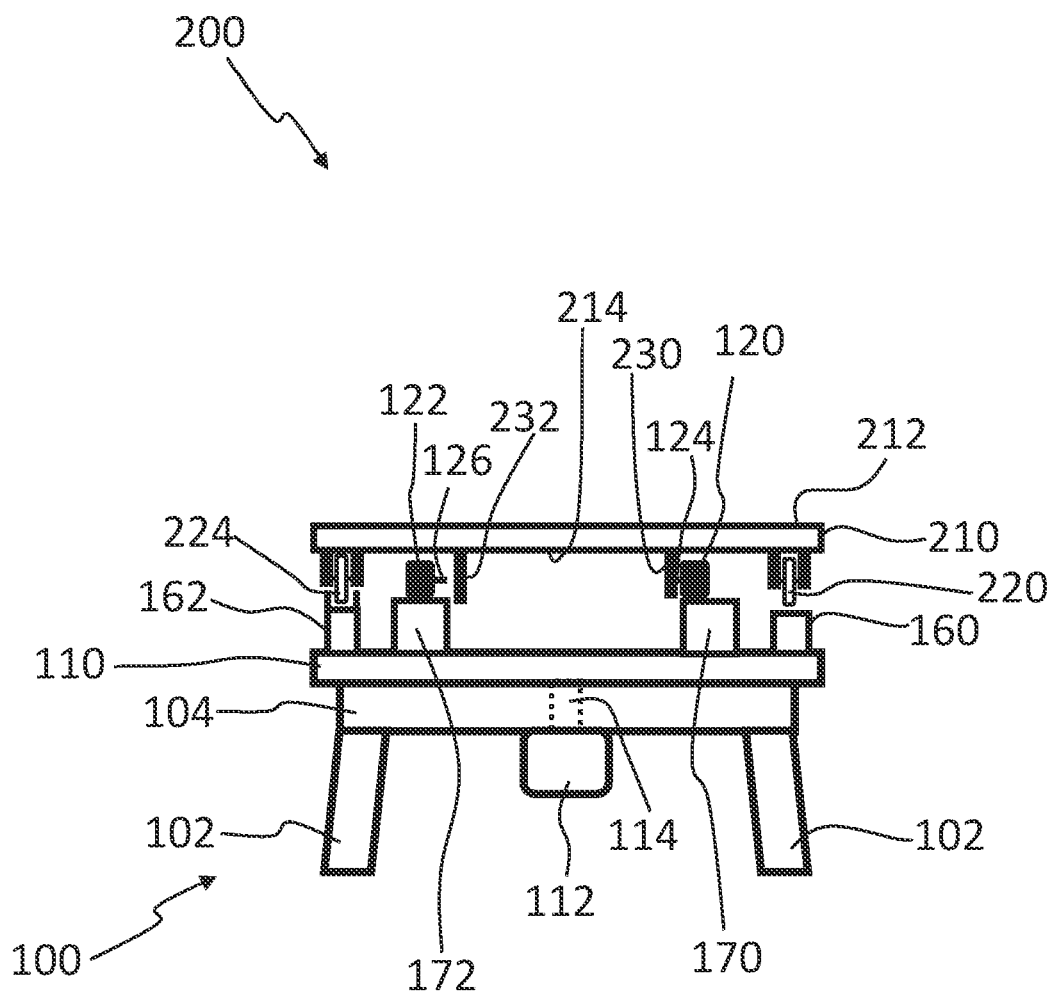
FIG. 13 shows schematically a reaction chamber on the loading device.

The first longitudinal support track comprises first support wheels 220 supported between opposite longitudinal wheel supports 221, 222. The first support wheels 220 are arranged successively along the first support track 220, 221, 222, as shown in FIG. 7. The first support wheels 220 are arranged to be supported to the first transport track 160, or to the first transport surface 164, as shown in FIG. 13.

The second longitudinal support track comprises first support wheels 224 supported between opposite longitudinal wheel supports 225, 226. The second support wheels 224 are arranged successively along the second support track 224, 225, 226. The second support wheels 224 are arranged to be supported to the second transport track 162, or to the second transport surface 166, as shown in FIG. 13.

Figure 8:
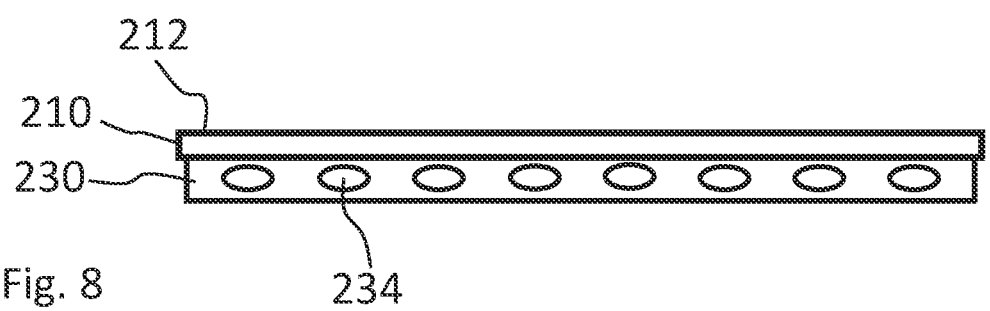
FIG. 8 shows a schematic side view of a counter connector element of a reaction chamber.

The chamber base 210 is further provided with a first longitudinal loading element 230 provided with two or more first counter connectors 234, as shown in FIG. 8. The first longitudinal loading element 230 is arranged to extend parallel to the first support track 220, 221, 222 and the two or more first counter connectors 234 are arranged successively in the direction of the first longitudinal loading element 230. The first counter connectors 234 are formed as first counter connector holes 234.

The chamber base 210 is further provided with a second longitudinal loading element 232 provided with two or more second counter connectors 234. The second longitudinal loading element 232 is arranged to extend parallel to the first support track 220, 221, 222 and the first longitudinal loading element 230, and the two or more second counter connectors 234 are arranged successively in the direction of the second longitudinal loading element 232. The second counter connectors 234 are formed as second counter connector holes 234.

The first and second longitudinal loading elements 230, 232 are provided on the bottom surface 214 of the chamber base 210.

Alternatively, the first and second counter connectors are provided to the first and second support tracks 220, 221, 222, 224, 225, 226, respectively.

Figure 9:
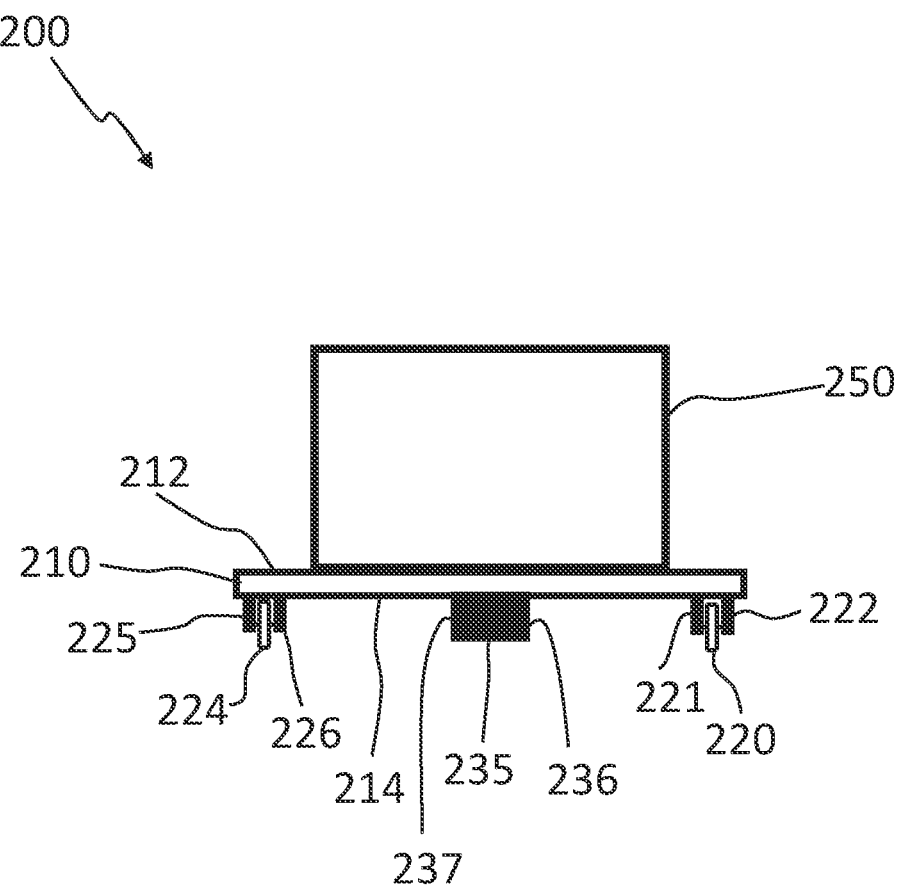
FIG. 9 shows a schematic end view of another embodiment of a reaction chamber.

FIG. 9 shows an alternative embodiment in which there is only one longitudinal loading element 235 provided to the chamber base 210. The longitudinal loading element 235 comprises first counter connectors 234 on a first side surface 236 arranged towards the first support track 220, 221, 222. The longitudinal loading element 235 comprises second counter connectors 234 on a second side surface 237 arranged towards the second support track 224, 225, 226.

Figure 10:
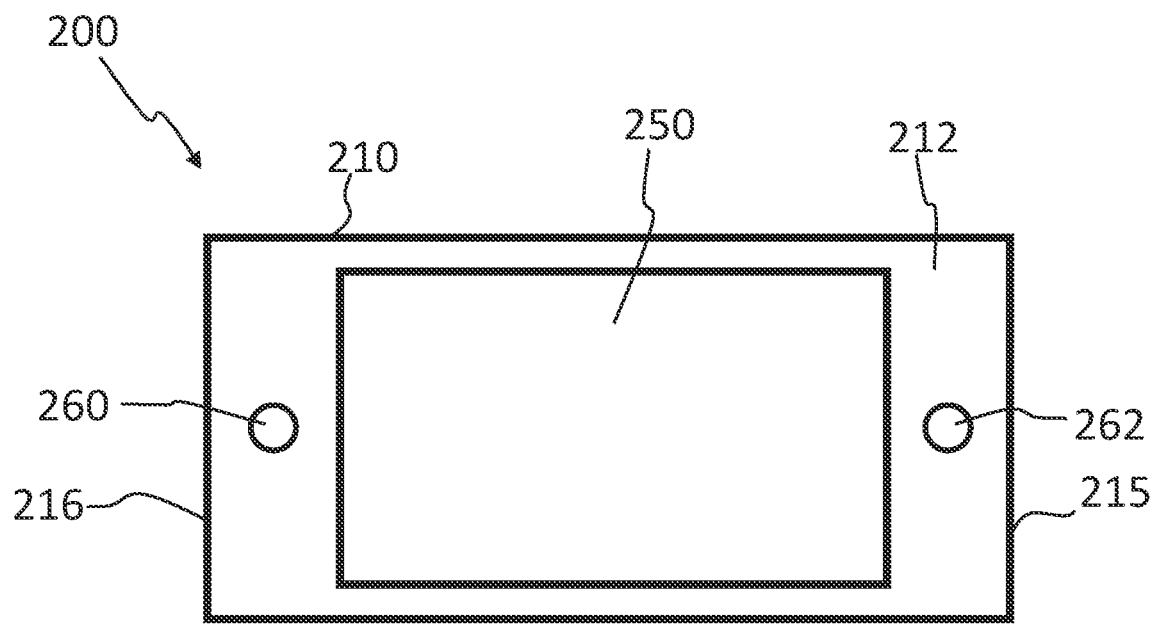
FIG. 10 shows a schematic top view a reaction chamber.

FIG. 10 shows a top view of the reaction chamber 200. The chamber base 210 comprises a gas discharge opening 260 provided between the second chamber end 216 of the chamber base 210 and the process chamber 250. The gas discharge opening 260 extends through the chamber base 210. The chamber base 210 comprises a gas supply opening 262 provided between the first chamber end 215 of the chamber base 210 and the process chamber 250. The gas supply opening 262 extends through the chamber base 210.

Figure 11:
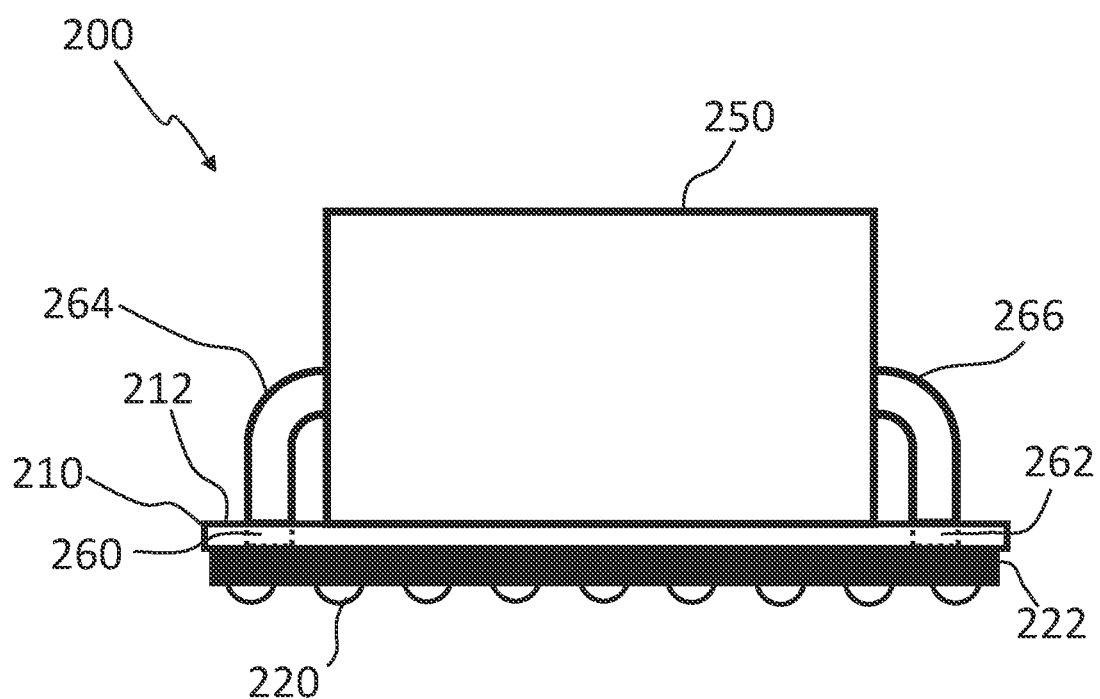
FIG. 11 shows a schematic side view a reaction chamber.

FIG. 11 shows a side view of the reaction chamber 200. The reaction chamber 200 comprises gas discharge conduit 264 extending between the gas discharge opening 260 and the process chamber 250. The reaction chamber 200 further comprises gas supply conduit 266 extending between the gas supply opening 262 and the process chamber 250.

Figure 12:
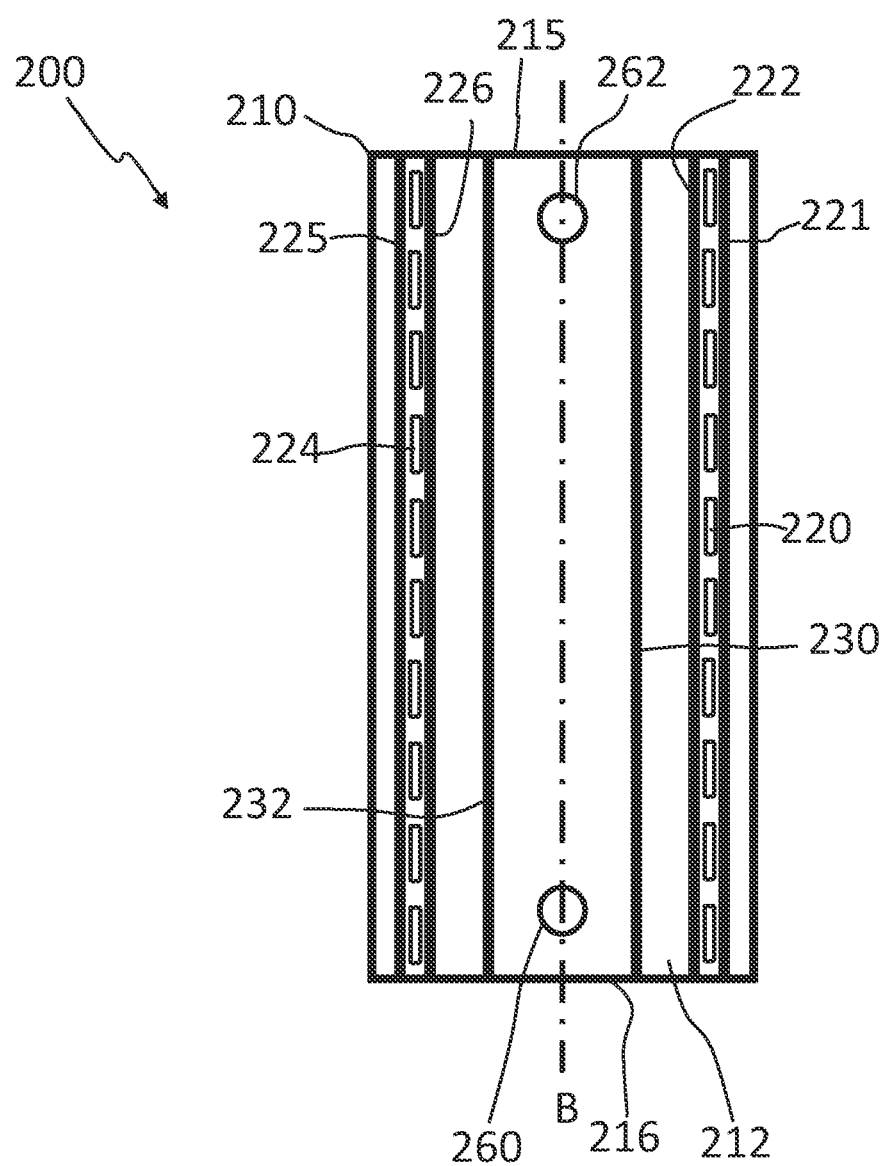
FIG. 12 shows a schematic bottom view a reaction chamber.

FIG. 12 shows a bottom view of the reaction chamber 200. The reaction chamber 200 and the chamber base 210 comprises the first chamber end 215 and the second chamber end 216, and third direction B extending between the first and second chamber ends 215, 216.

The first and second longitudinal loading elements 230, 232, and the first and second support tracks 220, 221, 222, 224, 225, 226 are arranged to extend in the third direction B.

The first and second longitudinal loading elements 230, 232, and the first and second support tracks 220, 221, 222, 224, 225, 226 are preferably arranged to extend in the third direction B and form the first chamber end 215 to the second chamber end 216.

FIG. 13 shows the reaction chamber 200 or the chamber base 210 supported to the loading device 100 and the loading platform 110. When the reaction chamber 200 is supported to the loading platform 110, the third direction B of the loading platform 110 is parallel first direction A of the loading platform 110. Further the first support track 220, 221, 222 is supported to the first transport track 160 and the second support track 224, 225, 226 is supported to the second transport track 162, and they extended parallel to each other.

In FIG. 13, the first loading arm 120 is arranged connected to the parallel first longitudinal loading element 230. Thus, the first loading connector 124 is connected to one of the first counter connectors 234 of the first longitudinal loading element 230. The second loading arm 122 is arranged disconnected from the parallel second longitudinal loading element 232. Thus, the second loading connector 126 is disconnected from the second counter connectors 234 of the second longitudinal loading element 232.

FIGS. 14 to 21 show a method for loading or unloading the reaction chamber 200 to and from the vacuum chamber 20. During loading and unloading the reaction chamber 200 is supported to the loading device 100 and loading platform 110 as shown in FIG. 13.

In the method the reaction chamber 200 movably supported to the loading device 100 such that the first direction A of the loading device 100 and the third direction B of the reaction chamber 200 extend parallel to each other.

First the first and second loading arms 120, 122 are disconnected from the reaction chamber.

Figure 14:
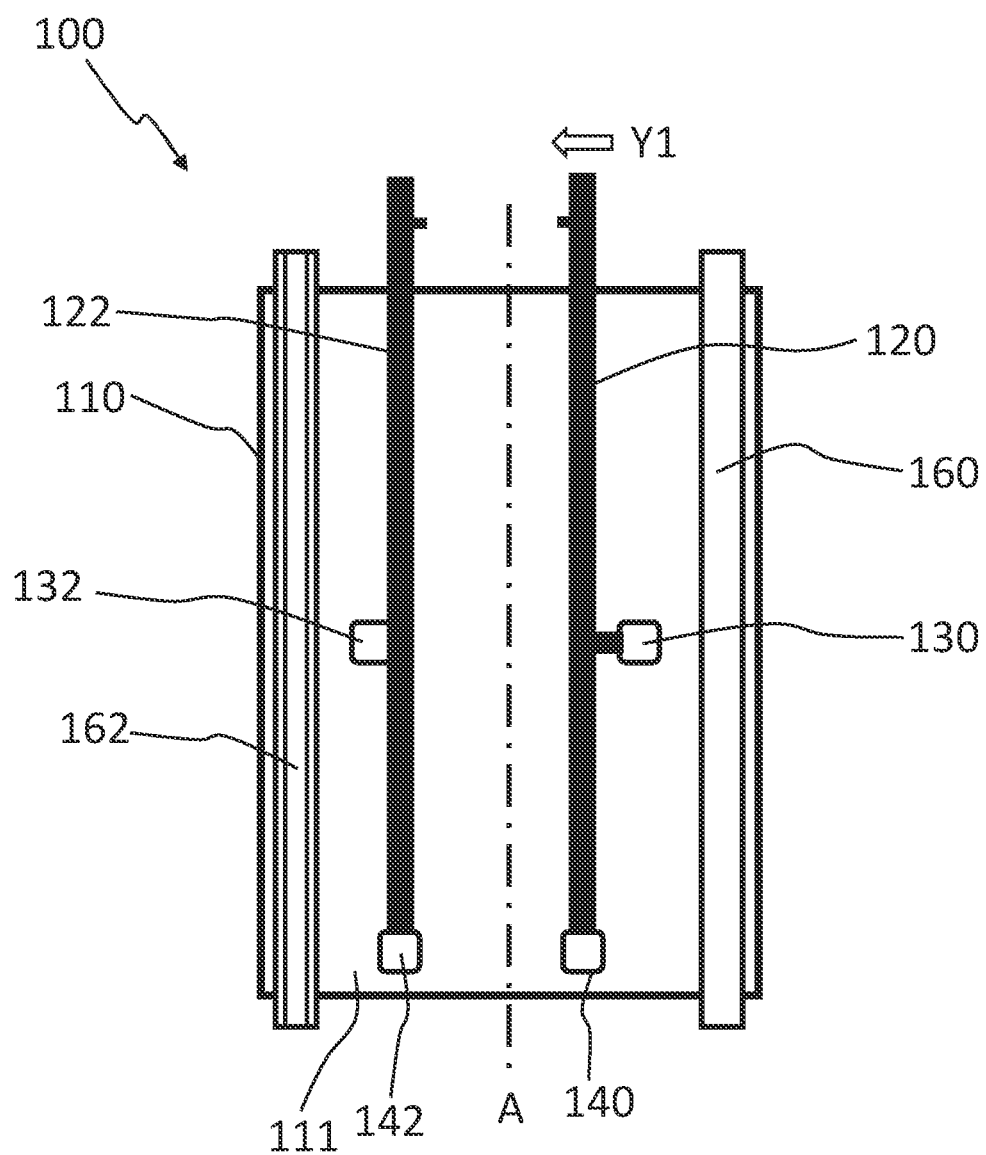
FIGS. 14, 15, 16, 17, 18, 19, 20 and 21 show schematically operation of the loading device.

As shown in FIG. 14, the method comprises connecting the first loading arm 120 to the reaction chamber 200. In the method the first loading arm 120 is moved to a first initial loading position in the second direction transversely to the first direction A with a first connection movement Y1 by the first connection motor 130. The first loading arm 120 is moved with the first connection movement Y1 towards the first loading element 230 and/or towards the second loading arm 122 such that the first loading connector 124 of the first loading arm 120 is connected to a first counter connector 234 of the reaction chamber 200 corresponding the first initial loading position.

Figure 15:
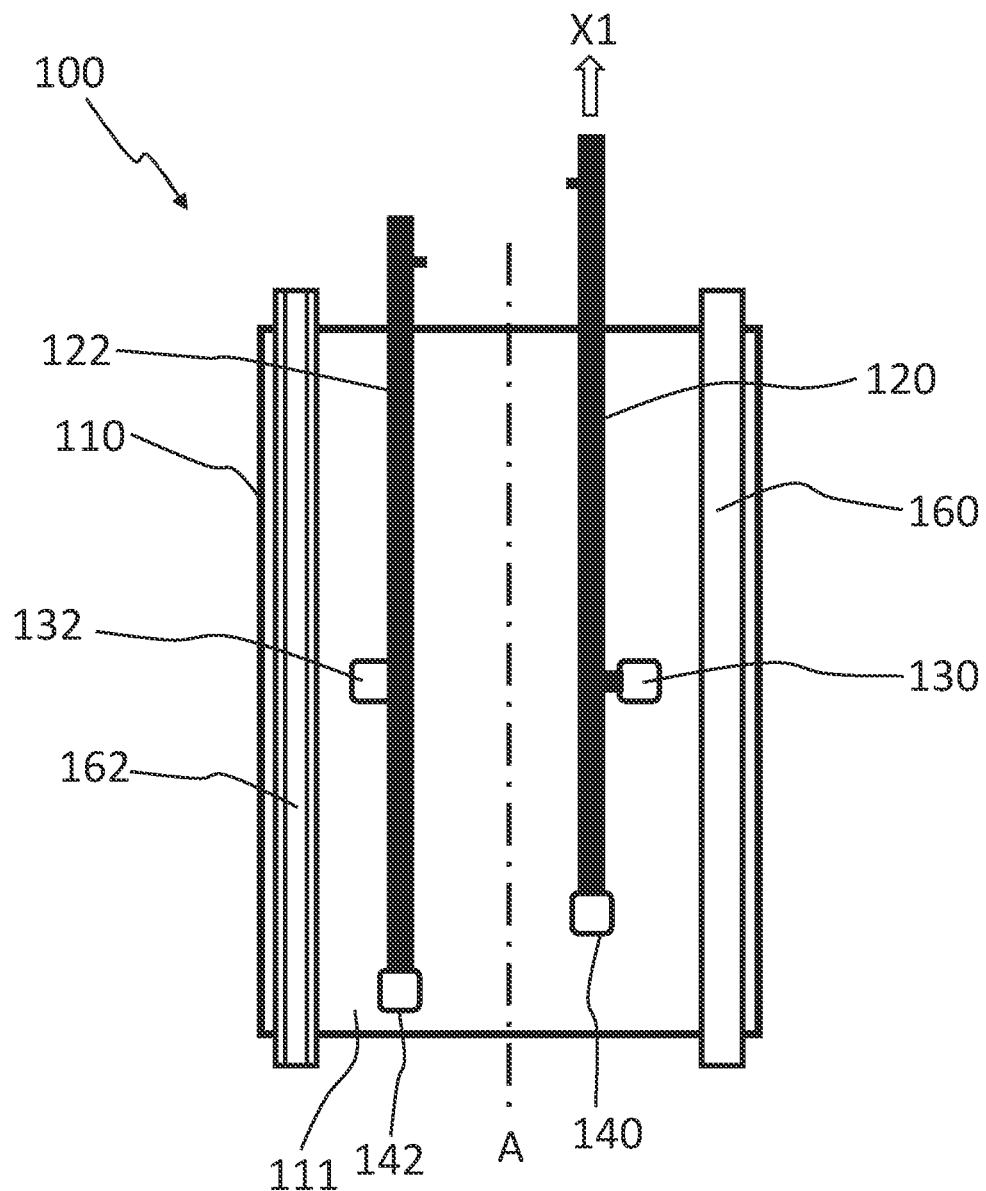

Then, as shown in FIG. 15, the reaction chamber 200 is moved towards the vacuum chamber 20 or forward in the first direction A by moving the first loading member 120 connected to the reaction chamber 200 to a first forward position in the first direction A with a first loading movement X1 by the first loading motor 140.

Figure 16:
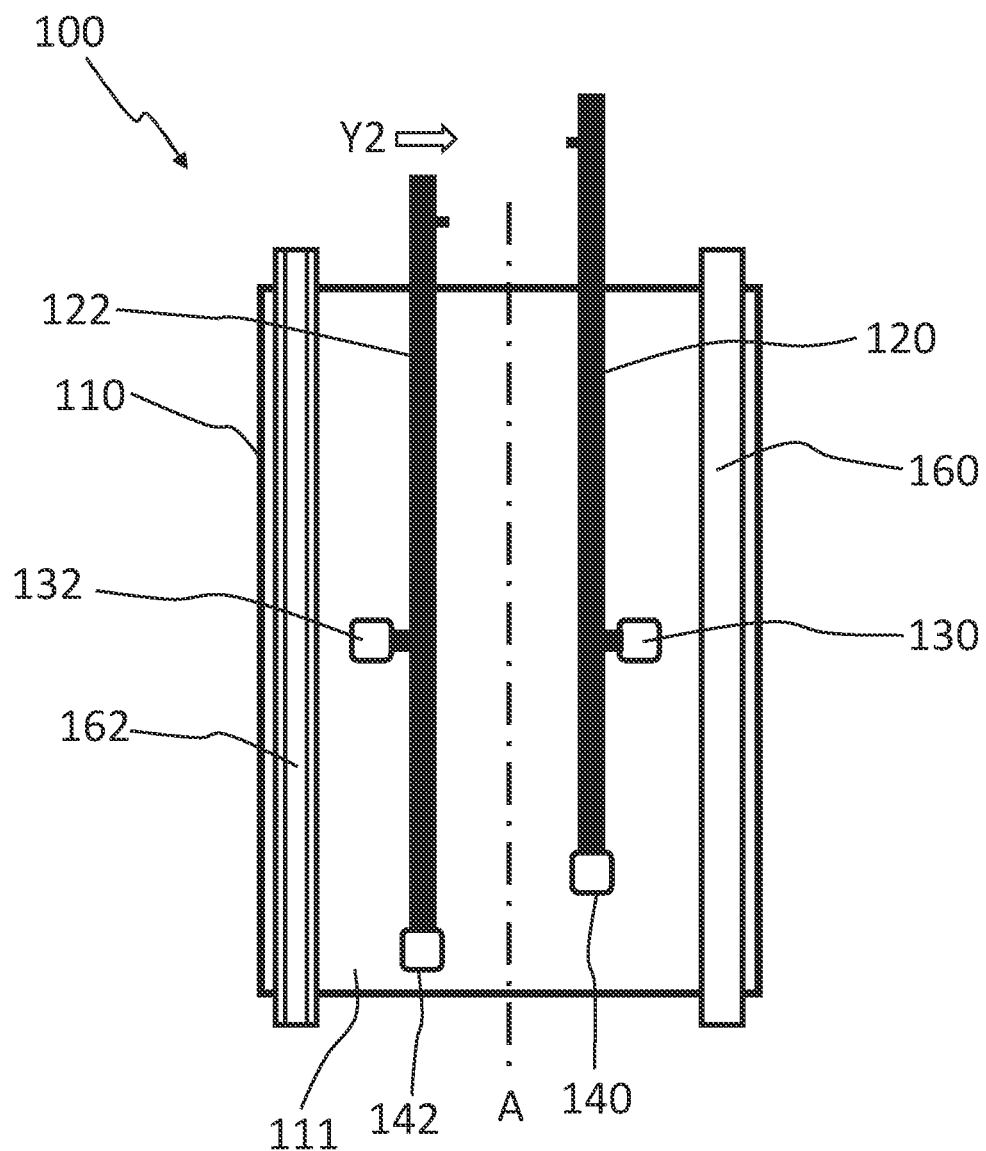

As shown in FIG. 16, the method comprises connecting the second loading arm 122 to the reaction chamber 200. In the method the second loading arm 122 is moved to a second initial loading position in the second direction transversely to the first direction A with a second connection movement Y2 by the second connection motor 132. The second loading arm 122 is moved with the second connection movement Y2 towards the second loading element 232 and/or towards the first loading arm 120 such that the second loading connector 126 of the second loading arm 122 is connected to a second counter connector 234 of the reaction chamber 200 corresponding the second initial loading position.

Figure 17:
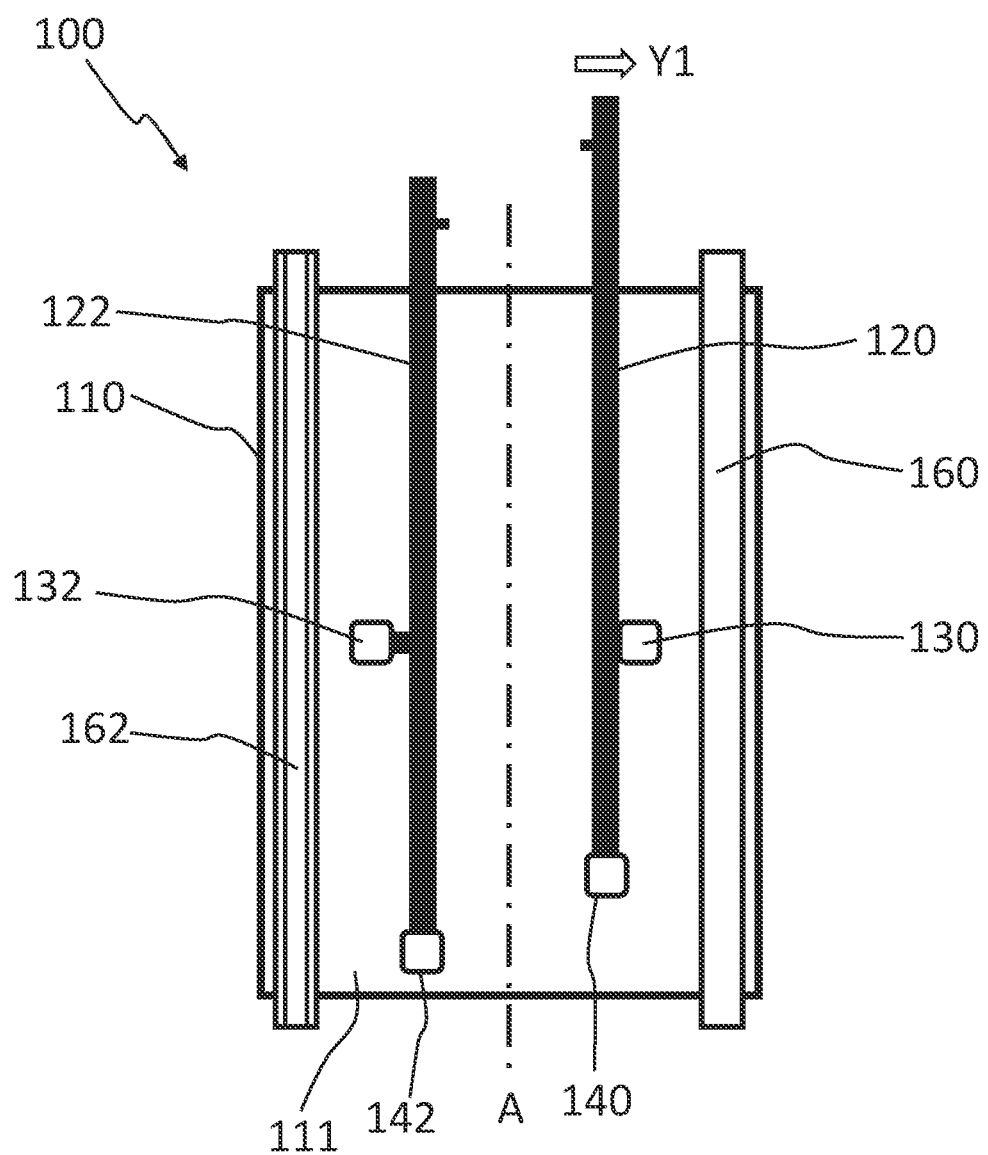

Then, as shown in FIG. 17, the method comprises disconnecting the first loading arm 120 from the reaction chamber 200. The disconnecting is carried out by moving the first loading arm 120 in the second direction transversely to the first direction A with the first connection movement Y1 by the first connection motor 130. The first loading arm 120 is moved with the first connection movement Y1 away from the first loading element 230 and/or away from the second loading arm 122 such that the first loading connector 124 of the first loading arm 120 is disconnected from the first counter connector 234 of the reaction chamber 200.

Figure 18:
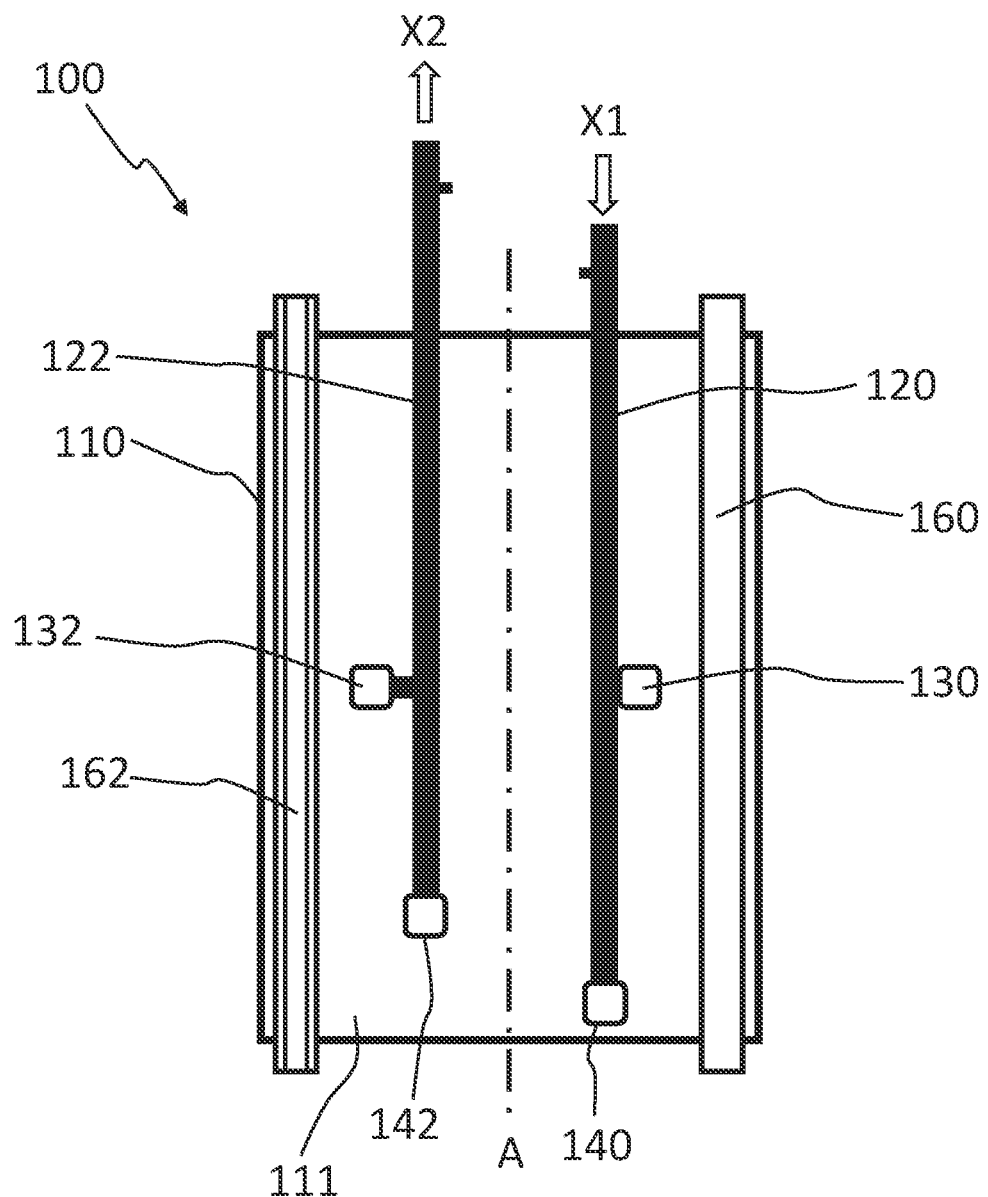

The method further comprises, as shown in FIG. 18, the reaction chamber 200 moving towards the vacuum chamber 20 or forward in the first direction A by moving the second loading member 122 connected to the reaction chamber 200 to a second forward position in the first direction A with the second loading movement X2 by the second loading motor 142.

Accordingly, the reaction chamber 200 is moved alternately with the first and second loading arms 120, 122 towards the vacuum chamber 20 during loading.

The method may further comprise, as shown in FIG. 18, moving the first loading arm 120, disconnected from the reaction chamber 200, to a first backward position in the first direction A away from the vacuum chamber 20. Thus, the first loading arm 120 is moved in the first direction A and backwards away from the vacuum chamber 20 with the first loading movement X1 by the first loading motor 140.

Figure 19:
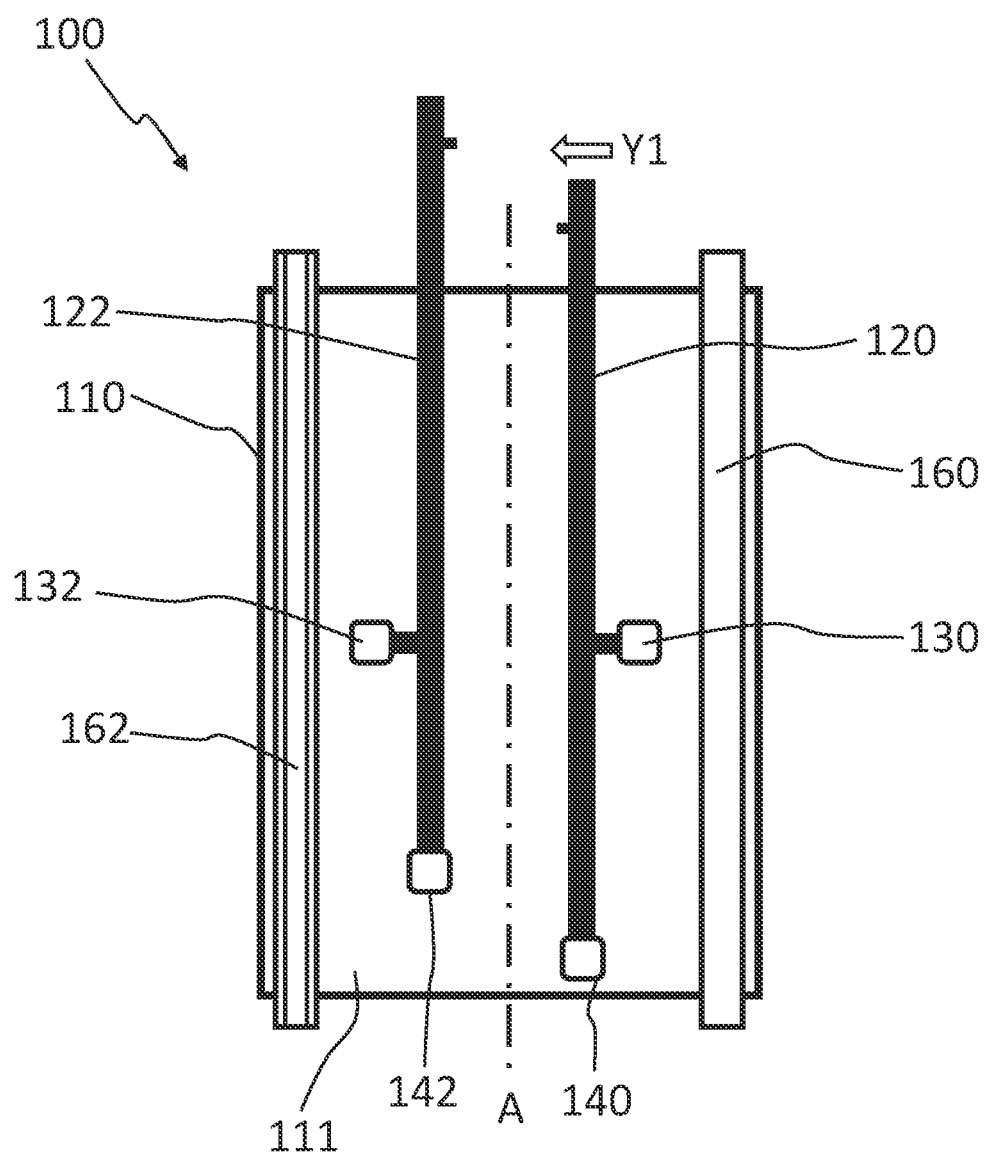

The method and loading may be continued such that the method comprises, connecting the first loading arm 120 to the reaction chamber 200. In the method the first loading arm 120 is moved with the first connection movement Y1 towards the first loading element 230 and/or towards the second loading arm 122 such that the first loading connector 124 of the first loading arm 120 is connected to the first counter connector 234 of the reaction chamber 200 corresponding the first backward position, as shown in FIG. 19.

Figure 20:
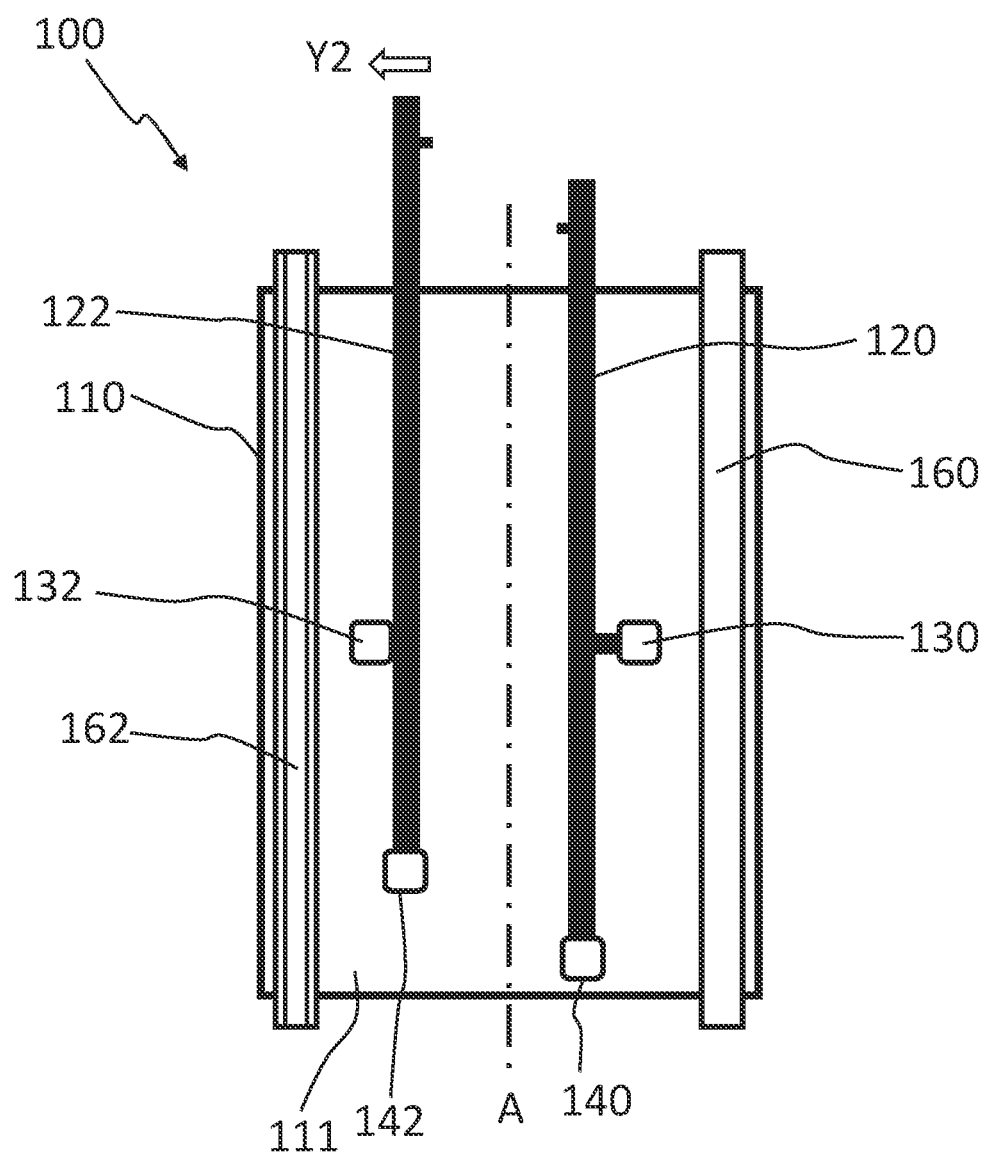

Then, as shown in FIG. 20, the method comprises disconnecting the second loading arm 122 from the reaction chamber 200. The disconnecting is carried out by moving the second loading arm 122 in the second direction transversely to the first direction A with the second connection movement Y2 by the second connection motor 132. The second loading arm 122 is moved with the second connection movement Y2 away from the second loading element 232 and/or away from the first loading arm 120 such that the second loading connector 126 of the second loading arm 122 is disconnected from the second counter connector 234 of the reaction chamber 200.

Figure 21:
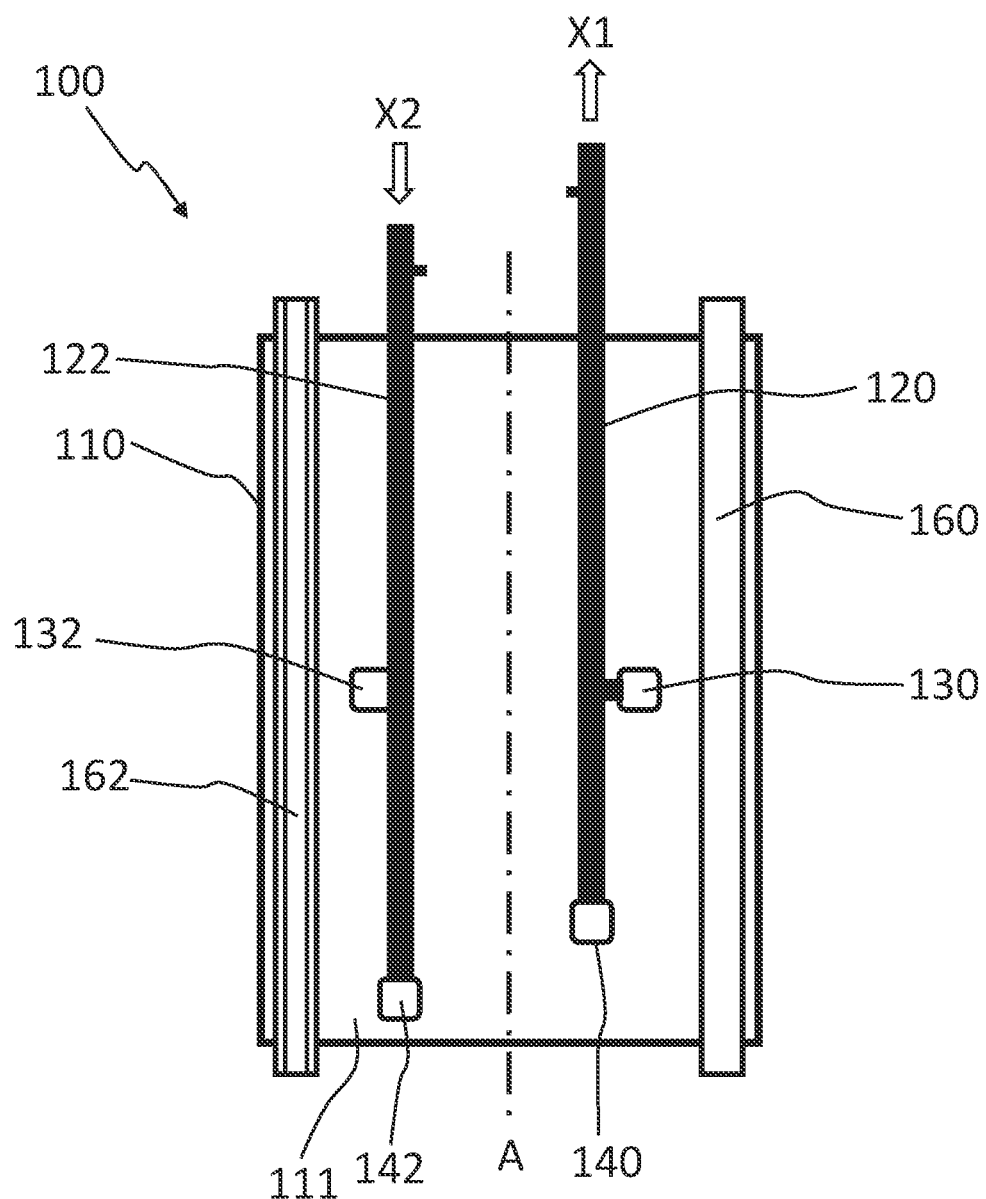

Then, as shown in FIG. 21, the reaction chamber 200 is further moved towards the vacuum chamber 20 or forward in the first direction A by moving the first loading member 120 connected to the reaction chamber 200 towards the vacuum chamber 20 in the first direction A with the first loading movement X1 by the first loading motor 140.

The method may further comprise, as shown in FIG. 21, moving the second loading arm 122, disconnected from the reaction chamber 200, to a second backward position in the first direction A away from the vacuum chamber 20. Thus, the second loading arm 122 is moved in the first direction A and backwards away from the vacuum chamber 20 with the second loading movement X2 by the second loading motor 142.

The above described alternating moving of the reaction chamber 200 with the first and second loading arms 120, 122 may be continued until the reaction chamber 200 is loaded inside the vacuum chamber 20.

The method may also comprise unloading the reaction chamber 200 from the vacuum chamber 20.

The method for unloading comprises first moving the first loading arm 120 forward to the vacuum chamber 20 with the first loading movement X1 in the first direction A by the first loading motor 140 to a first initial unloading position.

Then, the method comprises connecting the first loading arm 120 to the reaction chamber 200. In the method the first loading arm 120 is moved in the second direction transversely to the first direction A with the first connection movement Y1 by the first connection motor 130. The first loading arm 120 is moved with the first connection movement Y1 towards the first loading element 230 and/or towards the second loading arm 122 such that the first loading connector 124 of the first loading arm 120 is connected to the first counter connector 234 of the reaction chamber 200 corresponding the first initial unloading position.

Then, the reaction chamber 200 is moved away from the vacuum chamber 20 or backwards in the first direction A by moving the first loading member 120 connected to the reaction chamber 200 to a first backward position in the first direction A with a first loading movement X1 by the first loading motor 140.

The method for unloading comprises moving the second loading arm 122 forward to the vacuum chamber 20 with the second loading movement X2 in the first direction A by the second loading motor 140 to a second initial unloading position.

The method comprises connecting the second loading arm 122 to the reaction chamber 200. In the method the second loading arm 122 is moved in the second direction transversely to the first direction A with the second connection movement Y2 by the second connection motor 132. The second loading arm 122 is moved with the second connection movement Y2 towards the second loading element 232 and/or towards the first loading arm 120 such that the second loading connector 126 of the second loading arm 122 is connected to a second counter connector 234 of the reaction chamber 200 corresponding the second initial unloading position.

Then, the method comprises disconnecting the first loading arm 120 from the reaction chamber 200. The disconnecting is carried out by moving the first loading arm 120 in the second direction transversely to the first direction A with the first connection movement Y1 by the first connection motor 130. The first loading arm 120 is moved with the first connection movement Y1 away from the first loading element 230 and/or away from the second loading arm 122 such that the first loading connector 124 of the first loading arm 120 is disconnected from the first counter connector 234 of the reaction chamber 200.

Then, the reaction chamber 200 is moved away from the vacuum chamber 20 or backwards in the first direction A by moving the second loading member 122 connected to the reaction chamber 200 to a second backward position in the first direction A with the second loading movement X2 by the second loading motor 142.

Accordingly, the reaction chamber 200 is moved alternately with the first and second loading arms 120, 122 away from the vacuum chamber 20 during unloading.

The method may further comprise moving the first loading arm 120, disconnected from the reaction chamber 200, to a first forward position in the first direction A towards from the vacuum chamber 20. Thus, the first loading arm 120 is moved in the first direction A and forward towards the vacuum chamber 20 with the first loading movement X1 by the first loading motor 140.

The method and unloading may be continued such that the method comprises, connecting the first loading arm 120 to the reaction chamber 200. In the method the first loading arm 120 is moved with the first connection movement Y1 towards the first loading element 230 and/or towards the second loading arm 122 such that the first loading connector 124 of the first loading arm 120 is connected to the first counter connector 234 of the reaction chamber 200 corresponding the first forward position.

Then, the method comprises disconnecting the second loading arm 122 from the reaction chamber 200. The disconnecting is carried out by moving the second loading arm 122 in the second direction transversely to the first direction A with the second connection movement Y2 by the second connection motor 132. The second loading arm 122 is moved with the second connection movement Y2 away from the second loading element 232 and/or away from the first loading arm 120 such that the second loading connector 126 of the second loading arm 122 is disconnected from the second counter connector 234 of the reaction chamber 200.

The reaction chamber 200 is further moved away from the vacuum chamber 20 or backwards in the first direction A by moving the first loading member 120 connected to the reaction chamber 200 away from the vacuum chamber 20 in the first direction A with the first loading movement X1 by the first loading motor 140.

The method may further comprise moving the second loading arm 122, disconnected from the reaction chamber 200, to a second forward position in the first direction A towards the vacuum chamber 20. Thus, the second loading arm 122 is moved in the first direction A and forwards towards the vacuum chamber 20 with the second loading movement X2 by the second loading motor 142.

The above described alternating moving of the reaction chamber 200 with the first and second loading arms 120, 122 may be continued until the reaction chamber 200 is unloaded from the vacuum chamber 20.

Accordingly, in the present invention connecting the first loading connector 124 of the first loading member 120 to a first counter connector 234 of the reaction chamber 200 and disconnecting the first loading connector 124 of the first loading member 120 from the first counter connector 234 of the reaction chamber 200 is carried out by moving the first loading member 120 or the first loading connector 124 in the second direction with the first connection movement Y1 with the first loading motor 130.

Similarly, the connecting the second loading connector 126 of the second loading member 122 to a second counter connector 234 of the reaction chamber 200 and disconnecting the second loading connector 126 of the first loading member 122 from the second counter connector 234 of the reaction chamber 200 is carried out by moving the second loading member 122 or the second loading connector 126 in the second direction with the second connection movement Y2 with the second loading motor 132.

The invention has been described above with reference to the examples shown in the figures. However, the invention is in no way restricted to the above examples but may vary within the scope of the claims.

The invention claimed is:

1. A loading device for loading a reaction chamber inside a vacuum chamber, wherein the loading device comprises:
   a loading platform configured to support the reaction chamber, the loading platform having a first end, a second end and a first direction extending in a direction between the first end and the second end;
   a first loading member provided to the loading platform, the first loading member comprising a first loading connector; and
   a second loading member provided to the loading platform, the second loading member comprising a second loading connector, wherein
   the first loading member being configured to be independently movable in relation to the loading platform and the second loading member in a second direction transversal to the first direction, and
   the second loading member being configured to be independently movable in relation to the loading platform and the first loading member in a second direction transversal to the first direction; or the first loading connector of the first loading member being configured to be independently movable in relation to the loading platform and the second loading member in a second direction transversal to the first direction, and
   the second loading connector of the second loading member being configured to be independently movable in relation to the loading platform and the first loading member in a second direction transversal to the first direction.

2. The loading device according to claim 1, further comprising:
   a first loading motor connected to the first loading member and configured to move the first loading member in the first direction with a first loading movement; and
   a second loading motor connected to the second loading member and configured to move the second loading member in the first direction with a second loading movement.

3. The loading device according to claim 1, further comprising:
   a first connection motor connected to the first loading member and configured to move the first loading member in the second direction with a first connection movement, and
   a second loading motor connected to the second loading member and configured to move the second loading member in the second direction with a second connection movement; or
   a first connection motor connected to the first loading connector of the first loading member and arranged to move the first loading connector in the second direction with a second connection movement, and
   a second loading motor connected to the second loading connector of the second loading member and configured to move the second loading connector in the second direction with a second connection movement.

4. The loading device according to claim 1, wherein the first loading member comprises a first loading arm extending in the first direction and the second loading member comprises a second loading arm extending in the first direction, the first and second loading arms being configured to be spaced apart from each other.

5. The loading device according to claim 1, wherein:
   the first loading connector comprises a first connector pin, and the second loading connector comprises a second connector pin; or
   the first loading connector comprises a first connector hole, and the second loading connector comprises a second connector hole.

6. The loading device according to claim 5, wherein:
   the first and second connector pins extend in the second direction; or
   the first and the second connector hole extend in the second direction.

7. The loading device according to claim 1, wherein the loading platform comprises:
   a first transport track extending in the first direction; and
   a second transport track extending in the first direction and arranged spaced apart from the first transport track.

8. The loading device according to claim 1, further comprising a body, the loading platform being rotatably supported to the body.

9. The loading device according to claim 1, further comprising a vacuum chamber provided with a loading opening.

10. The loading device according to claim 1, wherein the first loading member is configured to be independently movable in relation to the loading platform in a second direction that is disposed at a non-parallel angle to the first direction.

11. The loading device according to claim 1, wherein the first loading connector of the first loading member is configured to be independently movable in relation to the loading platform in a second direction that is disposed at a non-parallel angle to the first direction.

12. The loading device according to claim 1, wherein at least one of the first loading member or the first loading connector of the first loading member is configured to be independently movable in relation to the loading platform in a second direction that is transverse to the first direction.

13. A loading device for loading a reaction chamber inside a vacuum chamber, wherein the loading device comprises:
- a loading platform configured to support the reaction chamber, the loading platform having a first end, a second end and a first direction extending in a direction between the first end and the second end;
- a body, the loading platform being rotatably supported to the body;
- a first loading member provided to the loading platform, the first loading member comprising a first loading connector; and
- a second loading member provided to the loading platform, the second loading member comprising a second loading connector, wherein
- the first loading member being configured to be independently movable in relation to the loading platform and the second loading member in the first direction,
- the second loading member being configured to be independently movable in relation to the loading platform and the first loading member in the first direction.

* * * * *